(12) United States Patent
Kim et al.

(10) Patent No.: US 11,729,531 B2
(45) Date of Patent: Aug. 15, 2023

(54) IMAGE SENSOR USING MULTIPLE TRANSFER, AND OPERATING METHOD OF THE IMAGE SENSOR

(71) Applicant: Samsung Electronics Co., Ltd., Suwon-si (KR)

(72) Inventors: Seoksan Kim, Suwon-si (KR); Minwoong Seo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 50 days.

(21) Appl. No.: 17/460,902

(22) Filed: Aug. 30, 2021

(65) Prior Publication Data
US 2022/0086380 A1 Mar. 17, 2022

(30) Foreign Application Priority Data
Sep. 16, 2020 (KR) .......................... 10-2020-0119312

(51) Int. Cl.
| | |
|---|---|
| *H04N 25/77* | (2023.01) |
| *H04N 25/71* | (2023.01) |
| *H01L 27/146* | (2006.01) |
| *H04N 25/75* | (2023.01) |

(52) U.S. Cl.
CPC ....... *H04N 25/77* (2023.01); *H01L 27/14609* (2013.01); *H04N 25/745* (2023.01); *H04N 25/75* (2023.01)

(58) Field of Classification Search
CPC .. H04N 5/3559; H04N 5/3597; H04N 5/3745; H04N 5/3765; H04N 5/378; H04N 25/59; H04N 25/626; H04N 25/745; H04N 25/75; H04N 25/77; H01L 27/14609
See application file for complete search history.

(56) References Cited

U.S. PATENT DOCUMENTS

| | | |
|---|---|---|
| 7,829,832 B2 | 11/2010 | Mauritzson et al. |
| 8,026,966 B2 | 9/2011 | Altice |
| 8,169,010 B2 | 5/2012 | Kim et al. |
| 8,717,473 B2 | 5/2014 | Koizumi |

(Continued)

FOREIGN PATENT DOCUMENTS

| | | |
|---|---|---|
| KR | 101251744 B1 | 4/2013 |
| KR | 101294479 B1 | 8/2013 |

*Primary Examiner* — Lin Ye
*Assistant Examiner* — Chriss S Yoder, III
(74) *Attorney, Agent, or Firm* — Muir Patent Law, PLLC

(57) ABSTRACT

An image sensor includes a pixel including a photoelectric conversion device configured to convert sensed light into charges and a floating diffusion node configured to store charges provided from the photoelectric conversion device, a timing generator configured to generate a reset signal including, prior to a light-sensing period, a first reset signal pulse for enabling an erasing of charges stored in at least one of the photoelectric conversion device and the floating diffusion node, and generate a transfer signal including, subsequent to the light-sensing period, at least two transfer signal pulses, each transfer signal pulse enabling a moving of charges stored in the photoelectric conversion device to the floating diffusion node, and a readout circuit configured to generate output data by summing results of performing at least two samplings for the floating diffusion node based on the at least two transfer signal pulses.

18 Claims, 13 Drawing Sheets

(56) References Cited

U.S. PATENT DOCUMENTS

| | | |
|---|---|---|
| 9,380,233 B2 * | 6/2016 | Yang .................... H04N 5/361 |
| 10,264,197 B2 | 4/2019 | Hirota |
| 10,440,287 B2 | 10/2019 | Jeong et al. |
| 10,680,032 B2 | 6/2020 | Kawahito |
| 2013/0020465 A1 | 1/2013 | Sa et al. |
| 2014/0211052 A1 | 7/2014 | Choi |
| 2019/0014276 A1 * | 1/2019 | Cheung ................ H04N 5/378 |

* cited by examiner

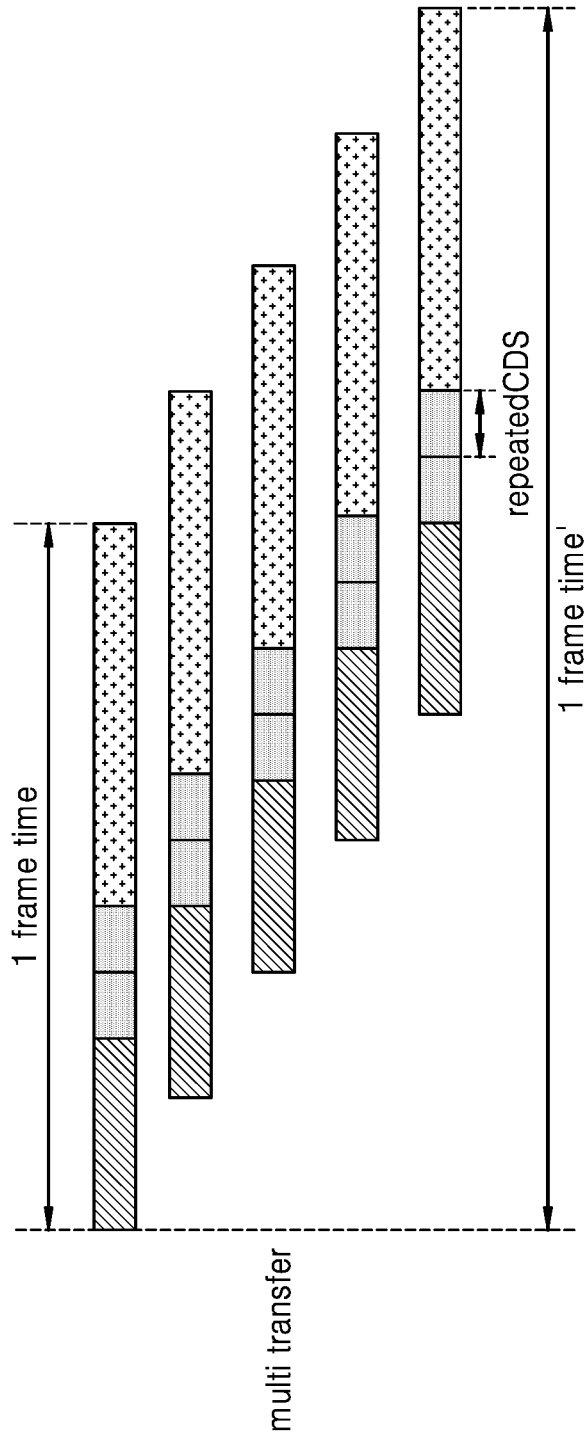

(1 frame time)'' = (1 frame time) + { (repeatCDS) }

IMAGE SENSOR USING MULTIPLE TRANSFER, AND OPERATING METHOD OF THE IMAGE SENSOR

CROSS-REFERENCE TO RELATED APPLICATION

This application is based on and claims priority under 35 U.S.C. § 119 to Korean Patent Application No. 10-2020-0119312, filed on Sep. 16, 2020, in the Korean Intellectual Property Office, the disclosure of which is incorporated by reference herein in its entirety.

BACKGROUND

Aspects of the inventive concept of the disclosure relate to an image sensor, and more particularly, to an image sensor that multiplexes electric charges and an operating method of the image sensor.

As an apparatus for capturing an image, a complementary metal oxide semiconductor (CMOS) image sensor is widely used. A three-transistor pixel structure, which is advantageous in terms of fill factor and manufacturing cost, and a four-transistor pixel structure, which has high responsiveness and sensitivity to light and is resistant to dark current and noise, are widely used in CMOS image sensors.

In a four-transistor pixel structure, when the potential of a floating diffusion node is improperly designed according to full well capacity (FWC) representing the maximum number of charges per pixel (i.e., the number of electrons a pixel can collect at saturation level), a backflow in which charges stored in the floating diffusion node flow backward may occur.

SUMMARY

An aspect of the inventive concept of the disclosure provides an image sensor capable of processing electric charges without being influenced by the potential of a floating diffusion node, and an operating method of the image sensor.

According to an aspect of the inventive concept of the disclosure, there is provided an image sensor including a pixel including a photoelectric conversion device configured to convert sensed light into charges and to store the charges prior to providing the charges to a floating diffusion node, and the floating diffusion node configured to store the charges provided from the photoelectric conversion device, a timing generator configured to generate a reset signal including, prior to a light-sensing period, a first reset signal pulse for enabling an erasing of charges stored in at least one of the photoelectric conversion device and the floating diffusion node, and generate a transfer signal including, subsequent to the light-sensing period, at least two transfer signal pulses, each transfer signal pulse enabling a moving of charges stored in the photoelectric conversion device to the floating diffusion node, and a readout circuit configured to generate output data by summing results of performing at least two samplings for the floating diffusion node based on the at least two transfer signal pulses, wherein the reset signal and the transfer signal each include a first logical level and a second logical level.

According to another aspect of the inventive concept of the disclosure, there is provided an operating method of an image sensor including a photoelectric conversion device and a floating diffusion node, the operating method including resetting the photoelectric conversion device and the floating diffusion node, converting sensed light into charges while a shutter of the image sensor is opened and closed once, transferring a first subset of the charges from the photoelectric conversion device to the floating diffusion node, resetting the floating diffusion node, and transferring a second subset of the charges from the photoelectric conversion device to the floating diffusion node.

According to another aspect of the inventive concept of the disclosure, there is provided an image sensor including a pixel array including at least one pixel including a photoelectric conversion device configured to convert sensed light into charges and a floating diffusion node, a row decoder configured to provide a control signal to the at least one pixel through at least one row line, a timing generator configured to generate a reset signal including, prior to a light-sensing period, a first reset signal pulse for enabling an erasing of charges stored in at least one of the photoelectric conversion device and the floating diffusion node, generate a transfer signal including, subsequent to the light-sensing period, at least two transfer signal pulses, each transfer signal pulse enabling a moving of charges stored in the photoelectric conversion device to the floating diffusion node, and generate a ramp signal for sampling, and a readout circuit configured to receive a pixel signal from the pixel array through at least one column line and generate output data by sampling the pixel signal based on the ramp signal.

BRIEF DESCRIPTION OF THE DRAWINGS

Embodiments of the inventive concept will be more clearly understood from the following detailed description taken in conjunction with the accompanying drawings in which:

FIGS. 8A and 8B are views for comparing processing speeds according to processing methods of an image sensor according to an example embodiment of the disclosure;

DETAILED DESCRIPTION OF THE EMBODIMENTS

Hereinafter, embodiments of the disclosure will be described in detail with reference to the accompanying drawings.

Figure 1:
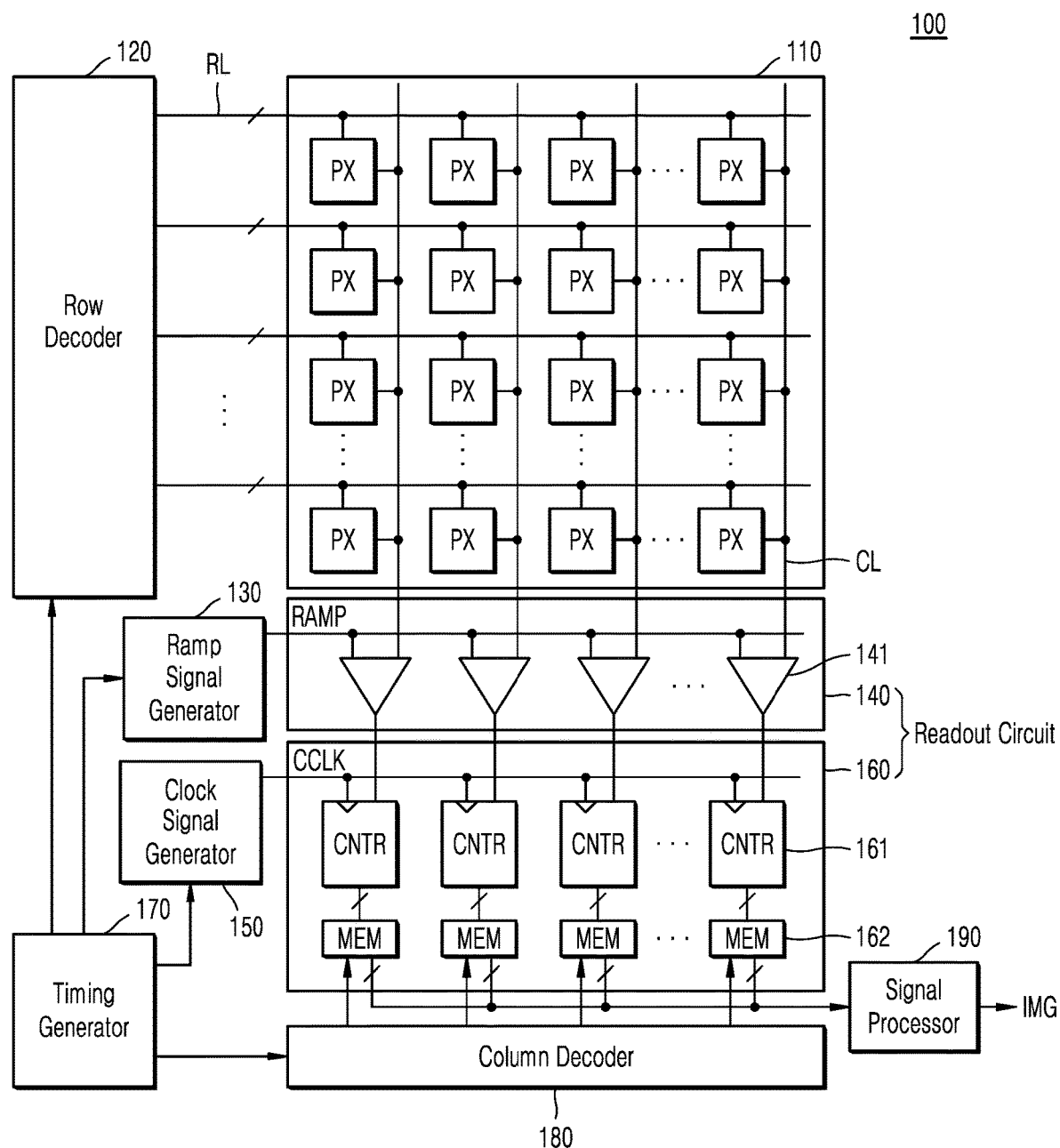
FIG. 1 is a block diagram of an image sensor according to an example embodiment of the disclosure.

FIG. 1 is a block diagram of an image sensor 100 according to an example embodiment of the disclosure.

The image sensor 100 may be mounted on an electronic device having an image or light sensing function. For example, the image sensor 100 may be mounted on an electronic device such as a camera, a smartphone, a wearable device, an Internet of things (IoT) device, a home appliance, a tablet personal computer (PC), a personal digital assistant (PDA), a portable multimedia player (PMP), a navigation device, a drone, an advanced drivers assistance system (ADAS), or the like. In addition, the image sensor 100 may be mounted on an electronic device provided as a component in a vehicle, furniture, manufacturing facilities, doors, various measuring devices, or the like.

Referring to FIG. 1, the image sensor 100 may include a pixel array 110, a row decoder 120, a ramp signal generator 130, a comparison circuit 140, a clock signal generator 150, a counting circuit 160, a timing generator 170, a column decoder 180, and a signal processor 190. The comparison circuit 140 and the counting circuit 160 may be referred to as a readout circuit.

The pixel array 110 may include a plurality of pixels PX arranged in a matrix form, and a plurality of row lines RL and a plurality of column lines CL connected to the plurality of pixels PX. Each of the plurality of row lines RL may extend in a row direction and may be connected to pixels PX arranged in the same row. For example, each of the plurality of row lines RL may transmit control signals output from the row decoder 120 to each of transistors included in a pixel PX, as illustrated in FIG. 2.

Each of the plurality of pixels PX according to an example embodiment of the disclosure may include at least one photoelectric conversion device (or photosensitive device) and a transistor. The photoelectric conversion device may sense light and convert the sensed light into photocharges. For example, the photoelectric conversion device may be a photosensitive device including an organic material or an inorganic material, such as an inorganic photodiode, an organic photodiode, a perovskite photodiode, a phototransistor, a photo gate, or a pinned photodiode. In an example embodiment, each of the plurality of pixels PX includes a plurality of photoelectric conversion devices. The transistor may transfer charges stored in the photoelectric conversion device, reset the photoelectric conversion to a power supply voltage, or convert the charges into an electrical signal.

According to an example embodiment, a voltage signal may be generated corresponding to the number of charges stored in a floating diffusion node. The principle that a voltage is proportional to the amount of charge but is inversely proportion to capacitance is used. In an example embodiment, any one of the transistors included in the pixel PX may invert and amplify the voltage of a floating diffusion node (or floating diffusion region) FD (see FIG. 2) in which photocharges from the photoelectric conversion device are stored, and output an amplified signal. The pixel PX will be described in more detail with reference to FIG. 2.

Each of the plurality of column lines CL may extend in a column direction and may be connected to pixels PX arranged in the same column. The plurality of column lines CL may transmit reset voltages and sensing voltages of the pixels PX to the comparison circuit 140 in units of rows of the pixel array 110.

The row decoder 120 may generate control signals for driving the pixel array 110 under the control of the timing generator 170, and may provide the control signals to each of the plurality of pixels PX of the pixel array 110 through the plurality of row lines RL. For example, the control signals may include a transfer signal, a reset signal, and/or a selection signal.

In an example embodiment, the row decoder 120 may control the plurality of pixels PX of the pixel array 110 so that the plurality of pixels PX detect incident light at the same time or in row units. In addition, the row decoder 120 may select pixels PX in row units from among the plurality of pixels PX, and may control the selected pixels PX to output, through the plurality of column lines CL, a reset voltage and a sensing voltage, which are generated by the selected pixels PX (e.g., pixels PXs in one row).

A voltage difference between the reset voltage and the sensing voltage may correspond to information on the amount of light received by each of the plurality of pixels PX. In an example embodiment, when the pixel PX does not receive light, the level of the reset voltage may be the same as the level of the sensing voltage, and when the pixel PX receives light, the level of the reset voltage may be different from the level of the sensing voltage. For example, output data of the pixel array 110 may be a difference between the level of the reset voltage and the level of the sensing voltage. A signal including a sensing voltage and a signal including a reset voltage may be referred to as pixel signals.

The ramp signal generator 130 may generate a ramp signal RAMP that increases or decreases with a certain slope and may provide the ramp signal RAMP to the comparison circuit 140.

The comparison circuit 140 may receive a pixel signal including a reset voltage or a sensing voltage from pixels PX of a row selected by the row decoder 120 from among the plurality of pixels PX. The comparison circuit 140 may generate and output pixel values corresponding to the plurality of pixels PX in row units by converting the pixel signal including a reset voltage or a sensing voltage into digital data based on the ramp signal RAMP from the ramp signal generator 130, the pixel signal being received from the pixel array 110 through the plurality of column lines CL.

The comparison circuit 140 may include a plurality of comparators 141. Each of the comparators 141 may compare a received pixel signal with a buffered ramp signal RAMP and output a comparison result as logic low or logic high.

A plurality of pixel signals output from the plurality of pixels PXs may have a deviation due to unique characteristics (e.g., fixed pattern noise (FPN), etc.) of each pixel PX and/or a deviation due to a characteristic difference between logics (e.g., transistors for outputting charges stored in a photoelectric conversion device in the pixel PX) for outputting the pixel signals from the pixels PX. An operation of obtaining a reset voltage (or reset component) and a sensing voltage (or sensing component) for each pixel signal and extracting a difference (e.g., a voltage difference) therebetween as a valid signal component, in order to compensate for a deviation between the plurality of pixel signals output through the plurality of column lines CL, is called correlated double sampling (CDS). The comparator 141 may output a comparison result (e.g., a comparison signal) to which the CDS is applied. As a result, the comparison circuit 140 may generate a comparison result to which the CDS is applied, and may be referred to as a CDS circuit.

In an example embodiment, the comparison circuit 140 may compare the reset signal and the sensing signal each with the ramp signal RAMP and generate a pixel value in digital form based on comparison results. For example, the comparison circuit 140 may generate a pixel value, which indicates the amount of light sensed by the pixel PX, by removing the sensing voltage from the reset voltage.

The clock signal generator 150 may provide a counting clock signal CCLK to the counting circuit 160 under the control of the timing generator 170. The counting circuit 160 may include a plurality of counters 161 and a plurality of memories 162.

Each of the counters 161 may be connected to a comparator 141 corresponding thereto and may count a comparison result output from the comparator 141. The counter 161 may count a comparison result of logic high or logic low, which is output from the comparator 141, based on the counting clock signal CCLK in a reset conversion period for sensing the reset signal and an image conversion period for sensing the sensing signal, and may also output digital data (e.g., a pixel value) according to a counting result.

Each of the memories 162 may store the digital data (e.g., the pixel value) for each row. In an example embodiment, the memory 162 may temporarily store a plurality of pieces of digital data output from the counter 161 and then amplify and output the digital data. That is, the memory 162 may function as an output buffer. The plurality of memories 162 may temporarily store digital data output from the plurality of counters 161, respectively, and then sequentially or selectively output the stored digital data to a sense amplifier (not shown), and the sense amplifier may amplify received digital data and output amplified data. The memories 162 may provide the signal processor 190 with a plurality of pieces of digital data amplified based on a signal from the column decoder 180 for selecting a column according to the control of the timing generator 170.

The timing generator 170 may control the timing of the row decoder 120, the ramp signal generator 130, and the clock signal generator 150. In an example embodiment, the timing generator 170 may provide control signals and/or clock signals to components of the image sensor 100, for example, the row decoder 120, the ramp signal generator 130, and the clock signal generator 150. The row decoder 120, the ramp signal generator 130, and the clock signal generator 150 may operate at a timing set for each component based on the control signals and/or clock signals provided from the timing generator 170. For example, the counter 161 may receive a counting signal and a counting clock signal CCLK from the timing generator 170, and may count a comparison result from the comparator 141 based on the counting clock signal CCLK in a period in which the counting signal is activated (for example, a period in which the counting signal is at logic high).

The timing generator 170 according to an example embodiment of the disclosure may generate a reset signal and a transfer signal in a light-sensing period, and may provide the reset signal and the transfer signal to the row decoder 120. The transfer signal may include a pulse. As used herein, a "pulse" may refer to a rapid transient change in the amplitude of a signal (e.g., the reset signal and the transfer signal) from a baseline level (e.g., "second logic level") to a higher/high level or lower/low level (e.g., "first logic level"), followed by a rapid return to the baseline level. As discussed in further detail with respect to FIG. 4 below, the timing generator 170 may generate the reset signal and the transfer signal such that subsequent to one shutter opening and closing period of a camera, at least two pulses of the transfer signal coincide with the reset signal in a state of a low level. Accordingly, even though the size of the potential well is small, charges accumulated in the pixel PX may be moved by at least two transmission operations. In addition, by providing the reset signal (i.e., a reset signal pulse) to the row decoder 120, the timing generator 170 may remove charges remaining in the potential well prior to one shutter opening and closing period of the camera, or may remove charges remaining after being read out from a space to which charges have been moved. The operation in which charges are removed may be referred to as a reset operation. Charge transport processing in the pixel PX using the reset signal and transfer signal of the timing generator 170 will be described in detail with reference to FIGS. 3A and 3B.

The timing generator 170 may be implemented as a processing circuit such as hardware including a logic circuit, or may be implemented as a combination of hardware and software, such as a processor that executes software performing a timing operation. In particular, the timing generator 170 may be implemented with a central processing unit (CPU), an arithmetic logic unit (ALU) that performs arithmetic and logic operations, bit shifts, and the like, a digital signal processor (DSP), a microprocessor, an application specific integrated circuit (ASIC), a control logic, etc., which may be included in the image sensor 100. However, embodiments are not limited thereto.

The signal processor 190 may perform image processing for changing the data format of the amplified digital data (for example, changing image data of a Bayer pattern to a YUV or RGB format), and image processing for improving image quality, such as noise removal, brightness adjustment, and sharpness adjustment, and thus, may output image data IMG. In an example embodiment, the signal processor 190 may perform pre-processing tasks for removing distortion of digital data about an image and improving algorithm performance, the pre-processing tasks including white balancing, denoising, demosaicking, lens shading, gamma correction, edge detection, and edge enhancement. As the signal processor 190 performs pre-processing, the speed of post-processing of the image data IMG may be improved.

In FIG. 1, an example in which the signal processor 190 is included in the image sensor 100 is illustrated for convenience of description. However, embodiments are not limited thereto. In an example embodiment, the signal processor 190 may be provided outside the image sensor 100 for space efficiency, or may function as a functional unit inside an application processor, thereby improving system resource efficiency.

Figure 2A:
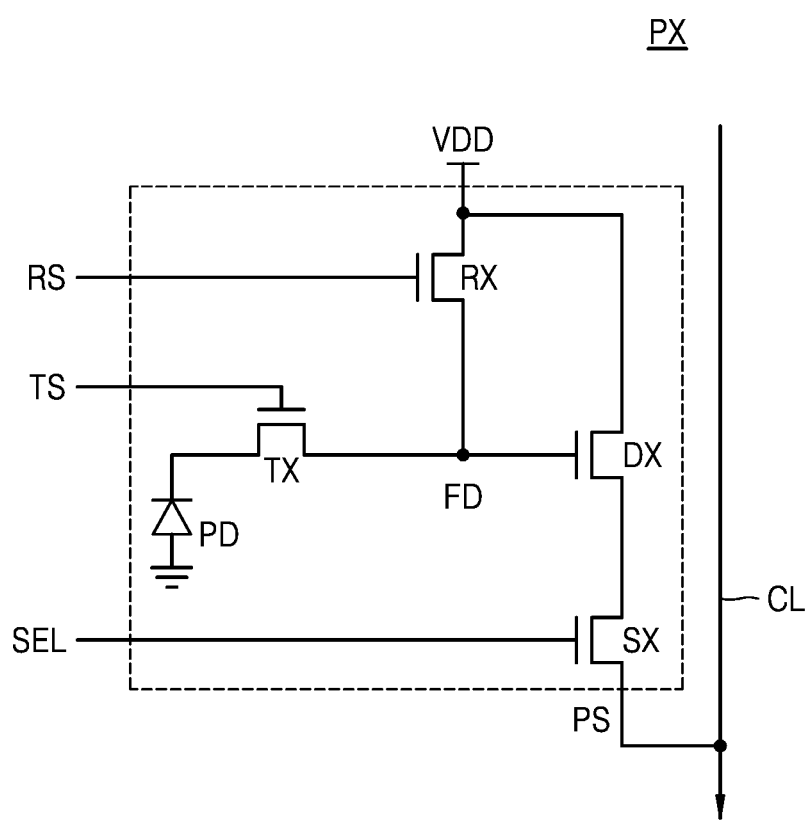
FIG. 2A is a circuit diagram of a pixel according to an example embodiment of the disclosure.
Figure 2B:
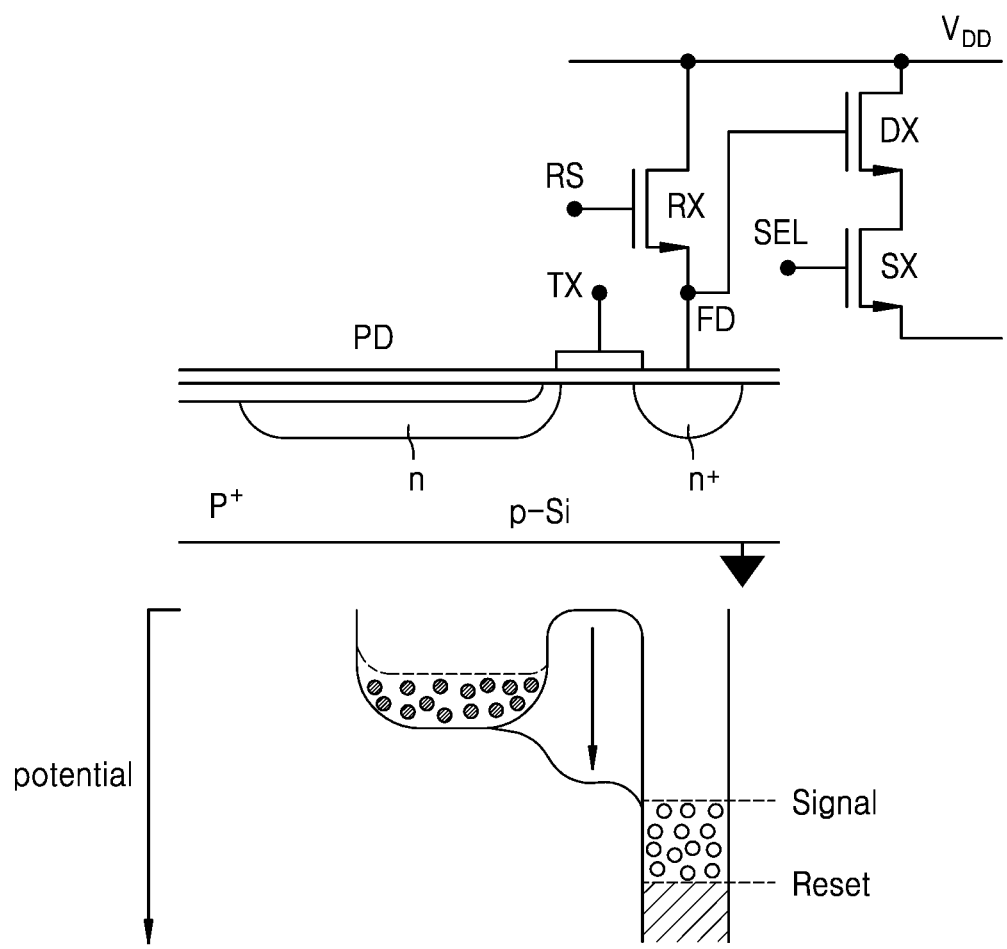
FIG. 2B illustrates a cross-sectional view of the pixel and a view showing the accumulation of charges corresponding to the pixel, according to an example embodiment of the disclosure.

FIG. 2A is a circuit diagram of a pixel PX according to an example embodiment of the disclosure, and FIG. 2B illustrates a cross-sectional view of the pixel PX and a view showing the accumulation of charges corresponding to the pixel PX, according to an example embodiment of the disclosure. The pixel PX of FIGS. 2A and 2B may perform the same function as the pixel PX of FIG. 1.

The pixel PX shown in FIG. 2A may be a pixel to which a four-transistor structure is applied. The four-transistor structure may include a transfer transistor TX, a reset transistor RX, a driving transistor DX, and a selection transistor SX. The four-transistor structure has higher responsiveness and sensitivity to light than a three-transistor structure, and is resistant to dark current and noise.

Referring to FIG. 2A, the pixel PX may include a photodiode PD as an example of a photoelectric conversion device, and may further include the transfer transistor TX, a floating diffusion node FD, the reset transistor RX, the driving transistor DX, and the selection transistor SX to amplify or control an output signal of the photoelectric conversion device. The photodiode PD is only an example of the photoelectric conversion device, and may be replaced with another type of photoelectric conversion device. Hereinafter, for convenience of description, a charge transfer operation of the pixel PX using the photodiode PD will be described. Furthermore, the transfer transistor TX, the reset transistor RX, the driving transistor DX, and the selection transistor SX are illustrated as metal oxide semiconductor field effect transistors (MOSFETs), but embodiments are not limited thereto.

The photodiode PD may generate photocharges that vary according to the intensity of incident light. Photocharges do not differ in electrical properties from charges, and thus, may be collectively referred to hereinafter as charges. The maximum capacity of storing charges in the photodiode PD may be referred to as full well capacity (FWC). One end of the photodiode PD may be connected to the transfer transistor TX, and the other end of the photodiode PD may be grounded.

One end (e.g., the source terminal) of the transfer transistor TX may be connected to the photodiode PD, and the other end (e.g., the drain terminal) of the transfer transistor TX may be connected to the floating diffusion node FD. A transfer signal TS generated by the timing generator 170 in FIG. 1 may be provided to the gate terminal of the transfer transistor TX through the row decoder 120 in FIG. 1.

According to an example embodiment, charges accumulated in the photodiode PD may be transferred to the floating diffusion node FD according to the level of the transfer signal TS provided to the gate terminal of the transfer transistor TX. For example, when the transfer signal TS is at a high level higher than the threshold voltage of the transfer transistor TX, the transfer transistor TX may be turned on and accordingly, the charges accumulated in the photodiode PD may be supplied to the floating diffusion node FD. For example, when the transfer signal TS is at a low level lower than the threshold voltage of the transfer transistor TX, the transfer transistor TX may be turned off and the charges stored in the photodiode PD may be maintained. Hereinafter, for convenience of description, it is assumed that a transfer signal TS at a high level is a signal higher than the threshold voltage of the transfer transistor TX and a transfer signal TS at a low level is a signal lower than the threshold voltage of the transfer transistor TX. In the disclosure, the term "high level" or "low level" is used as an example of a logic level. However, the high level or the low level in the inventive concept of the disclosure does not mean that the level of a signal has a constant value. The inventive concept of the disclosure is described using a logical and abstract concept such as 0 or 1, on or off, and up or down as a logic level.

The floating diffusion node FD may be a node commonly connected to the transfer transistor TX, the reset transistor RX, and the driving transistor DX. According to an example embodiment, the floating diffusion node FD may store charges generated by the photoelectric conversion device. Specifically, photocharges may be stored in a floating diffusion capacitor (not shown) formed by the floating diffusion node FD.

The reset transistor RX may reset the floating diffusion node FD to the level of a power supply voltage VDD according to a reset signal RS provided from the row decoder 120. In an example embodiment, the reset transistor RX may discharge charges stored in the floating diffusion node FD or the photodiode PD for accurate detection of a signal.

In an example embodiment, one end (e.g., the source terminal) of the reset transistor RX may be connected to a line of the power supply voltage VDD, and the other end (e.g., the drain terminal) of the reset transistor RX may be connected to the floating diffusion node FD. The reset signal RS generated by the timing generator 170 in FIG. 1 may be provided to the gate terminal of the reset transistor RX through the row decoder 120.

According to an example embodiment, the floating diffusion node FD connected to the other end of the reset transistor RX may be reset according to the level of the reset signal RS provided through the gate terminal of the reset transistor RX. For example, when the reset signal RS is at a high level higher than the threshold voltage of the reset transistor RX, the reset transistor RX may be turned on and accordingly, the power supply voltage VDD may be supplied to the floating diffusion node FD, and the potential of the floating diffusion node FD may increase as much as the power supply voltage VDD. For example, when the reset signal RS is at a low level lower than the threshold voltage of the reset transistor RX, the reset transistor RX may be turned off and the floating diffusion node FD may be in a floating state.

According to an example embodiment of the disclosure, a transfer signal TS at a high level may be supplied to the transfer transistor TX at least twice and accordingly, charges accumulated in the photodiode PD may be transferred to the floating diffusion node FD at least twice.

The driving transistor DX may amplify a signal. In an example embodiment, one end (e.g., the source terminal) of the driving transistor DX may be connected to a line of the power supply voltage VDD, and the other end (e.g., the drain terminal) of the driving transistor DX may be connected to the selection transistor SX. The gate terminal of the driving transistor DX may be connected to the floating diffusion node FD.

According to an example embodiment, the driving transistor DX may amplify a signal according to a potential corresponding to the amount of charges accumulated in the floating diffusion node FD, and transfer the amplified signal to the selection transistor SX. The driving transistor DX has a characteristic of amplifying charges and may be referred to as a source follower.

One end (e.g., the source terminal) of the selection transistor SX may be connected to one end (e.g., the drain terminal) of the driving transistor DX, and a pixel signal PS may be output to a column line CL connected to the pixel PX, according to a selection signal SEL output from the row decoder 120. The selection signal SEL may be provided to the gate terminal of the selection transistor SX. In an example embodiment, the selection transistor SX may be used for switching or addressing.

As described above with reference to FIG. 1, the pixel signal PS may be one of a signal including a reset voltage and a signal including a sensing voltage. The signal including the reset voltage may be a signal output from the selection transistor SX after the floating diffusion node FD is reset to the power supply voltage VDD by the reset transistor RX. The signal including the sensing voltage may be a signal output from the selection transistor SX after the floating diffusion node FD completes receiving charges from the transfer transistor TX. The pixel PX may sequentially output the pixel signal PS through the column line CL under the control of the row decoder 120.

FIG. 2B illustrates a cross-sectional view of the pixel PX and a view showing the accumulation of charges corresponding to the pixel PX, according to an example embodiment of the disclosure. FIG. 2B illustrates a cross-sectional view of the pixel PX and a view showing a potential according to positions viewed from the top of various transistors, that is, the reset transistor RX, the driving transistor DX, the selection transistor SX, and the transfer transistor TX, which are included in the pixel PX.

Referring to FIG. 2B, the transfer transistor TX is connected to the photodiode PD corresponding to an example of a photoelectric conversion device. One end (e.g., the source terminal) of the transfer transistor TX may be doped with n-type impurities, and the other end (e.g., the drain terminal) of the transfer transistor TX may also be doped with n-type impurities. A substrate of the pixel PX may be a poly-silicon substrate and may be doped with p-type impurities. However, it should be understood that a pixel PX using various polarities may be implemented without being limited to a doping type. Referring to FIG. 2B, a potential corresponding to a charge storage capacity of each of the photodiode PD and the floating diffusion node FD is shown under the substrate of the pixel PX. Voltage may be used as a unit of potential. According to an example embodiment, as charges accumulated in a potential well are electrons, the accumulation of the charges may cause a decrease in potential. For example, a certain amount of charges may be accumulated in the potential well of the floating diffusion node FD. In this case, a potential corresponding to a reset may be higher than a potential corresponding to a signal.

In an example embodiment, the power supply voltage VDD may be used as a turn-on voltage of the transfer transistor TX and the reset transistor RX, and a ground voltage may be used as a turn-off voltage of the transfer transistor TX and the reset transistor RX.

In an example embodiment, the transfer transistor TX may function as a potential barrier between the potential well of the photodiode PD and the floating diffusion node FD. For example, when the transfer signal TS is at a low level (or logic low), the transfer transistor TX may maintain a high potential barrier and accordingly, charges stored in the photodiode PD may be suppressed from being transferred to the floating diffusion node FD. Similarly, when the transfer signal TS is at a high level (or logic high), the transfer transistor TX may transfer charges stored in the photodiode PD to the floating diffusion node FD by lowering the potential barrier.

Information stored in the floating diffusion node FD may be information obtained by sensing an object to be imaged. For example, information obtained by sensing an object may be obtained by subtracting a potential of the floating diffusion node FD due to charges transferred as the transfer signal TS is at logic high from a potential of the floating diffusion node FD obtained as the transfer signal TS is at logic low.

In FIGS. 2A and 2B, a pixel PX having a four-transistor structure including one photodiode PD and four MOSFETs (i.e., the transfer transistor TX, the reset transistor RX, the driving transistor DX, and the selection transistor SX) has been described as an example. However, the structure of the pixel PX is not limited thereto and may be variously changed. The pixel PX may be implemented as a pixel employing a three-transistor or five-transistor structure, and the pixel PX may be implemented with a circuit including a photoelectric conversion device that generates photocharges according to the amount of light or intensity of light, and at least one transistor capable of outputting, as a current or voltage signal, the photocharges generated by the photoelectric conversion device. In addition, although an example in which the pixel PX includes N-type MOSFETs is illustrated in FIGS. 2A and 2B for convenience of description, embodiments are not limited thereto. According to the inventive concept of the disclosure, the pixel PX may include P-type MOSFETs doped with impurities having a polarity opposite to that of the N-type MOSFETs.

Figure 3A:
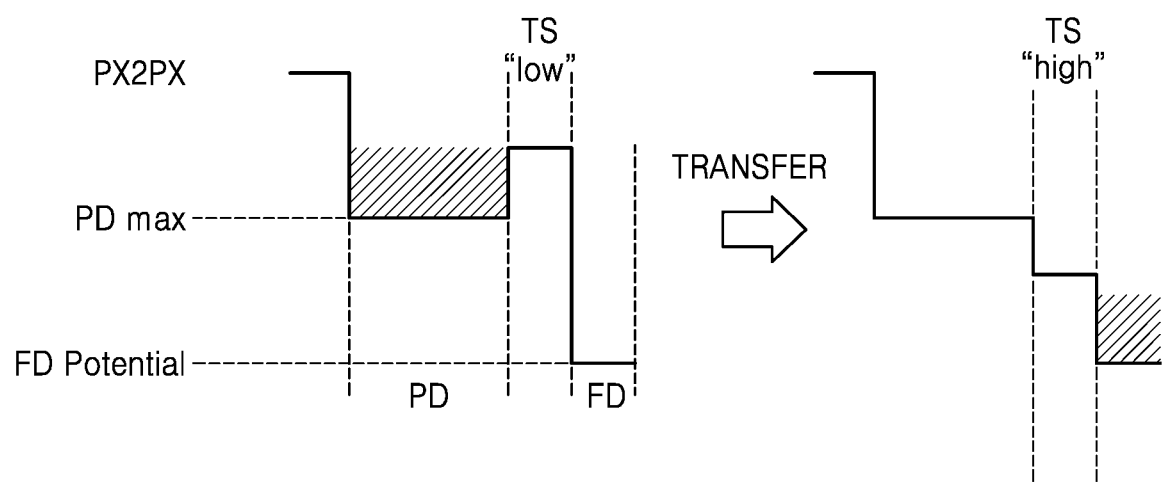
FIGS. 3A and 3B are views structurally illustrating potentials of a photodiode and a floating diffusion node, according to an example embodiment of the disclosure.
Figure 3B:
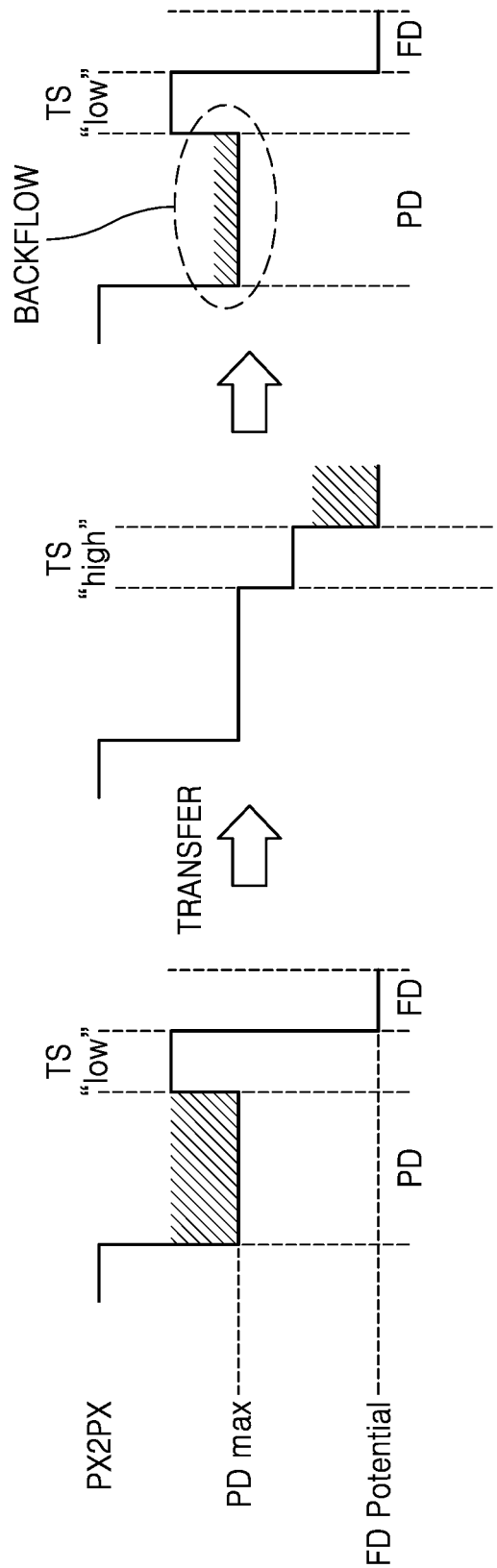

FIGS. 3A and 3B are views structurally illustrating potentials of a photodiode and a floating diffusion node. FIG. 2B is referenced in conjunction with FIGS. 3A and 3B. The vertical axes of the views of FIGS. 3A and 3B represent indicators related to charge potential. For example, in FIGS. 3A and 3B, PX2PX refers to a threshold voltage between pixels PX, PD max refers to a maximum potential of the photodiode PD, and FD Potential refers to a potential of the floating diffusion node FD.

In an example embodiment, because the threshold voltage PX2PX between the pixels PX is higher than the maximum potential PD max of the photodiode PD or the potential FD Potential of the floating diffusion node FD, charges accumulated in one pixel PX may not flow to another pixel PX.

In an example embodiment, because the maximum potential PD max of the photodiode PD is higher than the potential FD Potential of the floating diffusion node FD, when a threshold voltage between the photodiode PD and the floating diffusion node FD is lowered, charges accumulated in the photodiode PD may move to the floating diffusion node FD due to a potential difference.

Referring to FIG. 3A, charges may be accumulated in the photodiode PD. In an example embodiment, when the transfer signal TS input to the gate terminal of the transfer transistor TX in FIGS. 2A and 2B is at a low level, the threshold voltage of the transfer transistor TX may be kept high. For example, a potential barrier of the transfer transistor TX may be higher than a potential of the photodiode PD and a potential of the floating diffusion node FD. Accordingly, charges accumulated in the photodiode PD may not move to the floating diffusion node FD.

When the transfer signal TS transitions from a low level to a high level, the potential barrier of the transfer transistor TX may be lowered. In an example embodiment, charges stored in the photodiode PD may move to the floating diffusion node FD, which is a point having a relatively low potential according to a potential difference. In short, it may be understood that a charge transfer operation is performed as the transfer signal TS transitions from the low level to the high level.

In order to properly perform the charge transfer operation, the FWC of the photodiode PD and the FWC of the floating diffusion node FD need to correspond to each other. In an example embodiment, when the FWC of the floating diffusion node FD is greater than or equal to the FWC of the photodiode PD, all charges stored in the photodiode PD may be transferred to the floating diffusion node FD. In this case, there is no loss of charges, and the dynamic range of images may be sufficiently secured.

Referring to FIG. 3B, a case where the FWC of the floating diffusion node FD is less than the FWC of the photodiode PD will be described.

When the transfer signal TS transitions from a low level to a high level, the potential barrier of the transfer transistor TX may be lowered, and charges may move to the floating diffusion node FD. When the FWC of the floating diffusion node FD is less than the FWC of the photodiode PD, all charges stored in the photodiode PD may not be transferred to the floating diffusion node FD, or the potential well of the floating diffusion node may be full. Thereafter, when the transfer signal TS transitions from a high level to a low level, the potential barrier may increase again, and the photodiode PD and the floating diffusion node FD may be separated from each other again.

In a process in which the potential barrier increases as the transfer signal TS transitions from the high level to the low level, a phenomenon in which some of the charges transferred to the floating diffusion node FD move to a region of the photodiode PD may occur. The phenomenon may be referred to as a backflow phenomenon. When charges remain in the photodiode PD due to the backflow phenomenon, photocharges generated during a new light-sensing period and the remaining charges may be summed. As a result, because the number of charges of the photodiode PD is different from the number of charges generated according to the result of image sensing, a sensed object may not be accurately represented.

In order to prevent a backflow phenomenon, a sufficient backflow margin needs to be secured. It is not preferred to reduce the FWC of the photodiode PD to ensure sufficient dynamic range for the object. Therefore, it is necessary to sufficiently secure the FWC of the floating diffusion node FD. In order to increase the FWC of the floating diffusion node FD, a method of adjusting the width or depth of the potential well of the floating diffusion node FD or boosting the potential level of the floating diffusion node FD may be considered. However, there is a limit to increasing the FWC of the floating diffusion node FD when considering the difficulty and complexity of semiconductor circuit designs and processes, space cost, and conversion gain.

Charges stored in the floating diffusion node FD may be read out through sampling. However, because read output data does not include some of the charges, the read output data may not include all data of a sensed image. Accordingly, the read output data may not accurately represent the image, or may be data having at least a reduced dynamic range.

Hereinafter, with reference to FIG. 4, it is described that the inventive concept of the disclosure may provide an image sensor that is capable of sufficiently sampling sensed charges irrespective of the FWC of the floating diffusion node FD, has a high dynamic range and a high conversion gain, and is resistant to noise.

Figure 4:
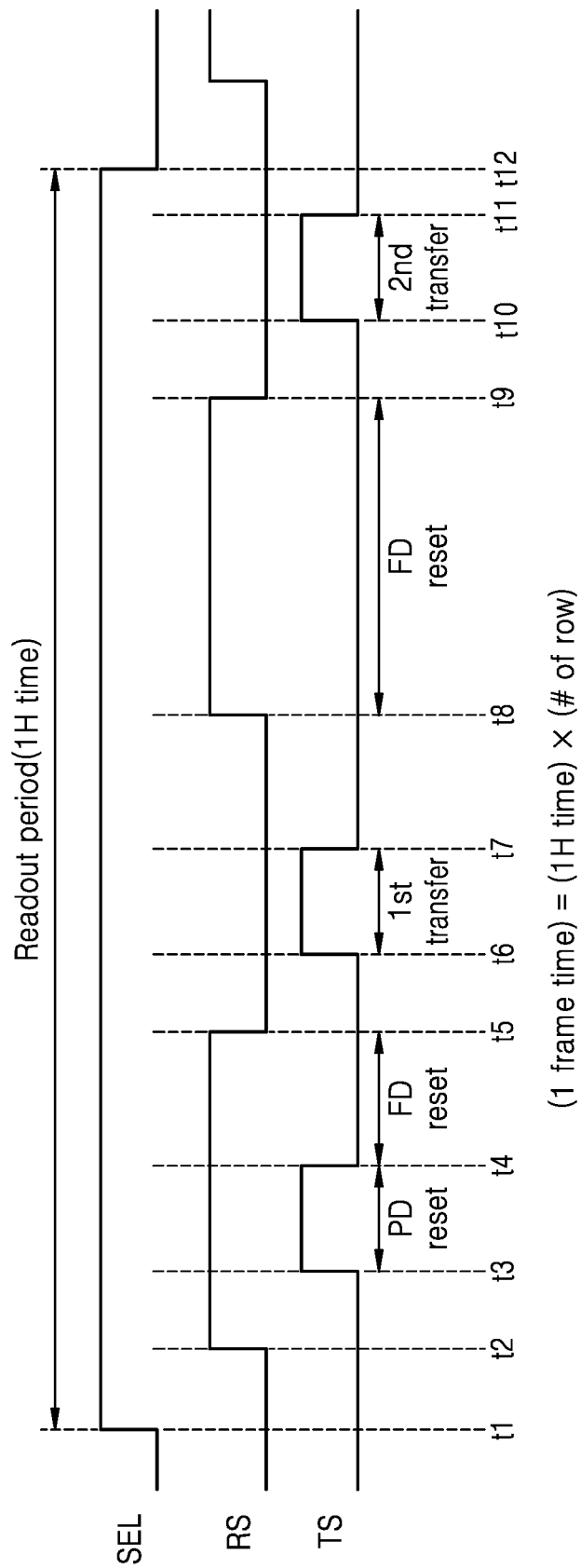
FIG. 4 is a timing diagram illustrating timing of a reset signal, a transfer signal, and a selection signal, according to an example embodiment of the disclosure.

FIG. 4 is a timing diagram illustrating timing of a reset signal, a transfer signal, and a selection signal, according to an example embodiment of the disclosure. The horizontal axis of the timing diagram of FIG. 4 represents time, and the vertical axis of the timing diagram represents the logic level of each signal. FIG. 4 is referenced in conjunction with FIGS. 1 and 2B.

At time t1, the selection signal SEL may transition from a low level to a high level. The selection signal SEL may select one pixel PX from among a plurality of pixels PX of the pixel array 110 in FIG. 1. The selection signal SEL may maintain a high level from time t1 to time t12. The row decoder 120 in FIG. 1 may select any one of a plurality of rows, and pixels PX connected to the selected row may substantially and simultaneously operate. Accordingly, a time period (i.e., from time t1 to time t12) in which the logic level of the selection signal SEL is maintained at a high level may correspond to a horizontal sensing time 1H of the pixel array 110. The horizontal sensing time 1H may be referred to as a readout time. As a result of imaging an object for a unit time, frame data may be generated. One frame data may correspond to the horizontal sensing time 1H and the number of rows constituting the frame data.

Between time t2 and time t5 a reset signal pulse is provided. At time t2, the reset signal RS may transition from a low level to a high level. In this case, because the transfer signal TS is at a low level, the photodiode PD and the floating diffusion node FD may be separated from each other by a potential barrier. Because the other end (e.g., the drain terminal) of the reset transistor RX is connected to the floating diffusion node FD, the remaining charges stored in the floating diffusion node FD may be removed as the reset signal RS transitions to a high level.

At time t3, the reset signal RS is maintained at a high level, and the transfer signal TS may transition from a low level to a high level. As the transfer signal TS transitions to a high level, the potential barrier between the photodiode PD and the floating diffusion node FD may sink, and the power supply voltage VDD supplied to the floating diffusion node FD may also be supplied to the photodiode PD. As a result, both the photodiode PD and the floating diffusion node FD may be reset by losing the accumulated charges.

Specifically, during a period in which the transfer transistor TX is turned on while the reset transistor RX is turned on, a low impedance may be maintained between the photodiode PD and the drain of the reset transistor RX. In addition, charges accumulated in the photodiode PD may flow outside the pixel PX and thus the photodiode PD may be reset.

At time t4, the transfer signal TS may transition to a low level. As the reset signal RS is still at a high level at time t4, the remaining charges stored in the floating diffusion node FD may be removed. An operation between time t4 and time t5 may be similar to the operation from time t2 to time t3.

In an example embodiment, after the photodiode PD is reset and during a period in which the reset transistor RX is turned on, the floating diffusion node FD may be reset. Accordingly, the voltage of the floating diffusion node FD may be fixed to a voltage obtained by subtracting the threshold voltage of the reset transistor RX from the power supply voltage VDD.

At time t5, the reset signal RS may transition from a high level to a low level. When the reset signal RS is at a low level, the reset transistor RX may be turned off, and when the transfer signal TS is at a low level, the transfer transistor TX may be turned off. That is, none of the reset operation and the transfer operation may be performed. A period between time t2 and time t5 may be referred to as an initialization period of the pixel PX. In addition, a period from time t5 to time t6 may be an opening/closing period of a shutter or a light-sensing period. That is, in a time period from time t5 to time t6, charges may be generated as an object is sensed by the photodiode PD.

Between time t6 and time t7 a transfer signal pulse may be provided. At time t6, the reset signal RS may be at a low level, but the transfer signal TS may transition from a low level to a high level. As the transfer signal TS reaches a high level, the potential barrier between the photodiode PD and the floating diffusion node FD may sink, and a threshold voltage may decrease. Accordingly, the charges accumulated in the photodiode PD may move to the floating diffusion node FD.

According to an example embodiment of the disclosure, even though the FWC of the floating diffusion node FD is less than the FWC of the photodiode PD, the amount of charges acceptable by the floating diffusion node FD may be first transferred from the photodiode PD. Charge transfer from time t6 to time t7 may be referred to as a first transfer operation.

At time t7, the transfer signal TS may transition from a high level to a low level. As the transfer signal TS reaches a low level, the potential barrier between the photodiode PD and the floating diffusion node FD may rise and the threshold voltage may increase. Accordingly, charges accumulated in the photodiode PD may stay in the potential well of the photodiode PD without moving to the floating diffusion node FD.

According to an example embodiment of the disclosure, between time t7 and time t8, as the transfer signal TS at a low level is transmitted, an operation of reading charges stored in the floating diffusion node FD may be performed. For example, the readout circuit (i.e., the comparison circuit 140 and the counting circuit 160 in FIG. 1) may sample charges stored in the floating diffusion node FD to thereby convert the charges into a signal, and the signal may be converted into binary data.

According to an example embodiment of the disclosure, a backflow phenomenon may occur as the potential barrier of the transfer transistor TX rises at time t7. However, as will be described later, despite the occurrence of the backflow phenomenon, charges generated by sensing through a second transfer operation from time t10 to time t11 may be completely processed by the image sensor 100.

Between time t8 and time t9 another reset signal pulse may be provided. At time t8, the transfer signal TS may maintain a low level and the reset signal RS may transition from a low level to a high level. As the transfer signal TS maintains a low level, the photodiode PD and the floating diffusion node FD are separated from each other by a potential barrier. However, because the reset signal RS is at a high level, the power supply voltage VDD may be supplied to the floating diffusion node FD. Accordingly, the remaining charges stored in the floating diffusion node FD may be removed.

At time t9, the transfer signal TS may maintain a low level, but the reset signal RS may transition from a high level to a low level. A time period from time t9 to time t10 may be similar to the time period from time t5 to time t6.

Between time t10 and time t11 another transfer signal pulse may be provided. At time t10, the reset signal RS may maintain a low level, but the transfer signal TS may transition from a low level to a high level. As the transfer signal TS transitions to a high level, the potential barrier between the photodiode PD and the floating diffusion node FD may sink, and the threshold voltage may decrease. Accordingly, charges accumulated in the photodiode PD may move to the floating diffusion node FD.

At time t11, the reset signal RS may maintain a low level, but the transfer signal TS may transition from a high level to a low level. A time period from time t11 to time t12 may be a period in which a transfer operation or a reset operation is not performed.

According to an example embodiment of the disclosure, because charges as a result of sensing an object in one light-sensing period (or an opening/closing period of a shutter) remains in the photodiode PD, charge transfer occurring from time t10 to time t11 may correspond to a second transfer operation following the first transfer operation from time t6 to time t7.

When the FWC of the floating diffusion node FD is not large enough compared to the FWC of the photodiode PD, charges generated by sensing the object may not completely move to the floating diffusion node FD. According to an example embodiment of the disclosure, by performing a transfer operation at least twice subsequent to one light-sensing period (or subsequent to an opening/closing period of a shutter), charges accumulated in the photodiode PD may be sufficiently sampled without depending on the FWC of the floating diffusion node FD. Accordingly, the dynamic range of output data obtained by sensing the object may be improved. In addition, because it is not necessary to increase the physical size (width or depth) of the floating diffusion node FD in order to improve the FWC of the floating diffusion node FD, space cost may be reduced.

Although an example in which a transfer operation is performed twice is described in the disclosure for convenience of description, the inventive concept of the disclosure is not limited thereto, and it should be understood that transfer operations of N times or more (N is a natural number of 3 or more) may be performed.

Although an example in which time t2 and time t3 are separated from each other is illustrated in FIG. 4 for convenience of description, the inventive concept of the disclosure is not limited thereto. Because the floating diffusion node FD only needs to be reset once, time t2 and time t3 may overlap with each other and accordingly, only the reset of the floating diffusion node FD at time t4 and time t5 may be used, and conversely, it should be understood that time 4 and time 5 may overlap each other.

In short, the image sensor 100 according to the inventive concept of the disclosure may generate a transfer signal TS having a high level at least twice during a light-sensing period and apply the transfer signal TS to the pixel PX, and accordingly, the floating diffusion node FD may accept charges accumulated in the photodiode PD, regardless of the FWC of the floating diffusion node FD.

The image sensor 100 according to the inventive concept of the disclosure may secure a greater number of electrons per pixel in a photodiode PD having the same size of FWC and thus may secure a sufficiently high dynamic range of data obtained by sensing an object. In addition, because the image sensor 100 according to the inventive concept of the disclosure does not need to increase the FWC of the floating diffusion node FD, there is no need to boost the potential of the floating diffusion node FD or heighten the potential well of the floating diffusion node FD, and accordingly, deterioration of a conversion gain may be prevented. In addition, the image sensor 100 according to the inventive concept of the disclosure may avoid noise from accompanying the floating diffusion node FD.

In FIG. 4, two pulses enabling the moving of charges stored in the photoelectric conversion device to the floating diffusion node are illustrated in the transfer signal for simplicity of description. However, the number of pulses enabling the moving of charges stored in the photoelectric conversion device to the floating diffusion node included in the transfer signal is not limited thereto. The inventive concept of the disclosure may also be applied to a case in which two or more pulses enabling the moving of charges stored in the photoelectric conversion device to the floating diffusion node are included in the transfer signal.

Figure 5:
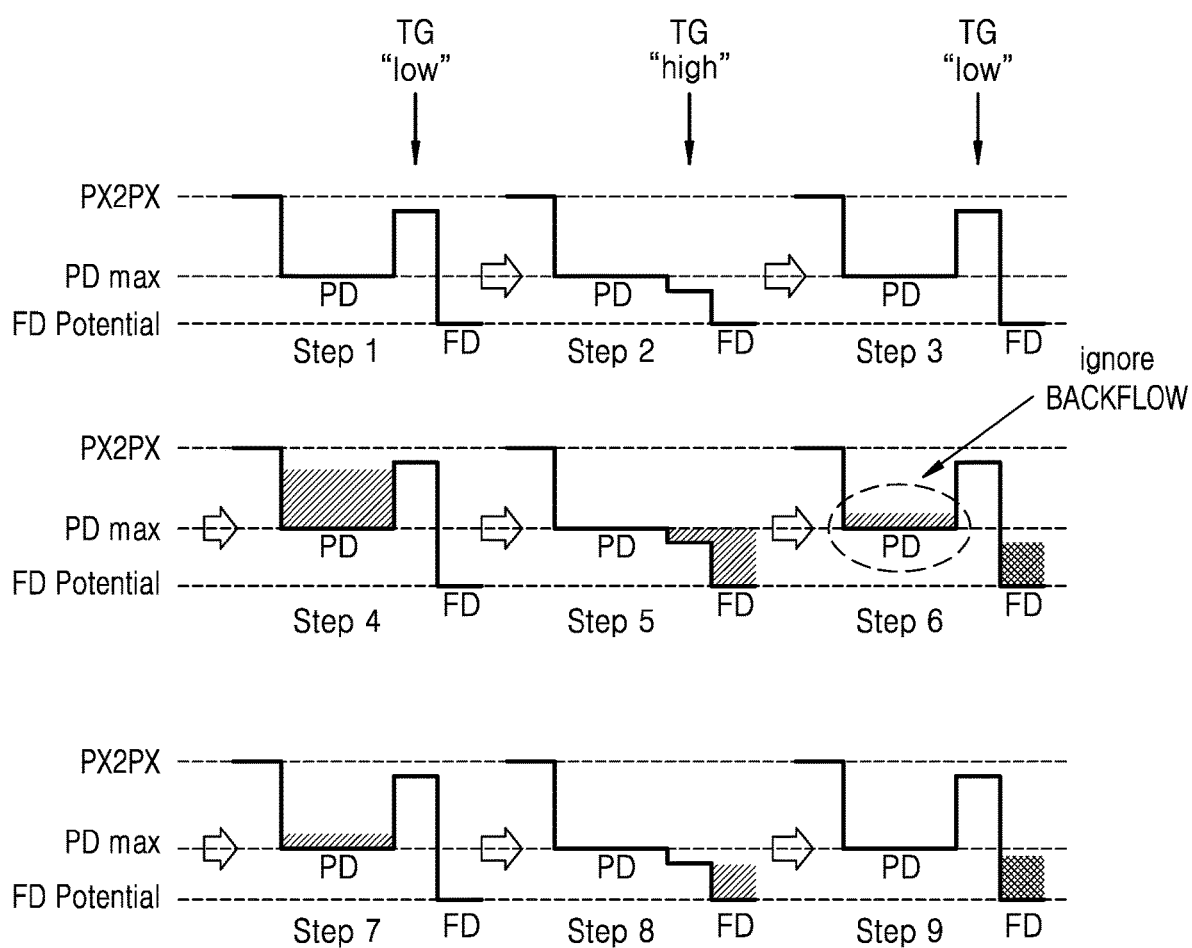
FIG. 5 is a view illustrating, in order, potentials of a photodiode and a floating diffusion node, according to an example embodiment of the disclosure.

FIG. 5 is a view illustrating, in order, potentials of a photodiode and a floating diffusion node, according to an example embodiment of the disclosure. As described above, PX2PX may refer to a threshold voltage between pixels, PD max may refer to the maximum potential of the photodiode, and FD Potential may refer to the potential of the floating diffusion node. FIG. 5 is referenced in conjunction with FIGS. 3A, 3B, and 4.

In step 1, the transfer signal TG may be at a low level. As shuttering is not yet performed, no photocharge may be generated by the photodiode PD. As the reset signal RG is at a high level, the power supply voltage VDD may be supplied to the floating diffusion node FD. As a result, there may be no charge in the floating diffusion node FD.

In step 2, the transfer signal TG may transition to a high level. As the shuttering is still not performed and the power supply voltage VDD is supplied to the floating diffusion node FD, both the photodiode PD and the floating diffusion node FD may be reset.

In step 3, the transfer signal TG may be at a low level. As the shuttering is still not performed and the power supply voltage VDD is supplied to the floating diffusion node FD, both the photodiode PD and the floating diffusion node FD may be reset.

That is, steps 1 to 3 may be understood as the initialization operation described with reference to FIG. 4.

In step 4, as a shutter is opened and closed, an object may be sensed. As a result of sensing the object, the photodiode PD may convert light into photocharges and, as a result, may store charges in a potential well. As the transfer signal TG is at a low level, a potential barrier due to the transfer transistor TX may be higher than the potential of total charges stored in the photodiode PD.

In step 5, the transfer signal TG may transition to a high level, and the charges stored in the photodiode PD may move to the floating diffusion node FD according to a potential difference.

In step 6, the transfer signal TG may transition back to a low level, and in this case, a backflow phenomenon may occur. However, in the technical concept of the disclosure, the backflow phenomenon may be ignored irrespective of the occurrence of a backflow. Transferred charges may be accumulated in the floating diffusion node FD.

That is, steps 4 to 6 may be understood as the first transfer operation described with reference to FIG. 4.

Between step 6 and step 7, sampling may be performed based on charges stored in the floating diffusion node FD and accordingly, sensed output data may be read. The charges (or the total amount of charges) stored in the floating diffusion node FD may be converted into a voltage.

In step 7, the transfer signal TG may be maintained at a low level, but the reset signal RG may transition to a high level, and accordingly, the charges stored in the floating diffusion node FD may be reset. According to an example embodiment, when charges that have not yet been removed remain in the floating diffusion node FD, the remaining charges may be mixed with charges transferred according to the second transfer operation, and this operation may interfere with accurate sensing of an object. Therefore, after the first transfer operation, the floating diffusion node FD is reset.

In step 8, the reset signal RG may be maintained at a low level, but the transfer signal TG may transition to a high level. Accordingly, remaining charges generated when the FWC of the photodiode PD is greater than the FWC of the floating diffusion node FD in the first transfer operation may move to the floating diffusion node FD. That is, the second transfer operation may be performed.

In step 9, the reset signal RG may be maintained at a low level, but the transfer signal TG may transition back from a high level to a low level. As sampling is performed based on the charges stored in the floating diffusion node FD, sensed output data may be read.

That is, steps 7 to 9 may be understood as the second transfer operation described with reference to FIG. 4.

According to an example embodiment of the disclosure, the voltage of output data output from the pixel PX may be represented by Equation 1 below.

$$V_{DOUT} = (V_{RESET} - V_{SENSE1}) + (V_{RESET} - V_{SENSE2})$$ [Equation 1]

In this case, $V_{DOUT}$ is the voltage of output data output from the pixel PX, $V_{SENSE1}$ is the voltage of a sensing signal according to the first transfer operation, $V_{SENSE2}$ is the voltage of a sensing signal according to the second transfer operation, and $V_{RESET}$ is the voltage of a reset signal when the floating diffusion node FD is reset. As described above with reference to FIG. 2B, as charges are accumulated in the potential well, the size of the potential of the floating diffusion node FD may decrease.

The voltage $V_{DOUT}$ of the output data that is a result of sensing an object may correspond to the sum of a difference between the potential (e.g., voltage) of the floating diffusion node FD when the reset operation is performed and the potential (e.g., voltage) of the floating diffusion node FD when the first transfer operation is performed and a difference between the potential (e.g., voltage) of the floating diffusion node FD when the reset operation is performed and the potential (e.g., voltage) of the floating diffusion node FD when the second transfer operation is performed.

According to the inventive concept of the disclosure, despite a FWC limitation of the floating diffusion node FD, as a multi-transfer operation is performed, charges accumulated in the photodiode PD may be processed without loss.

Figure 6:
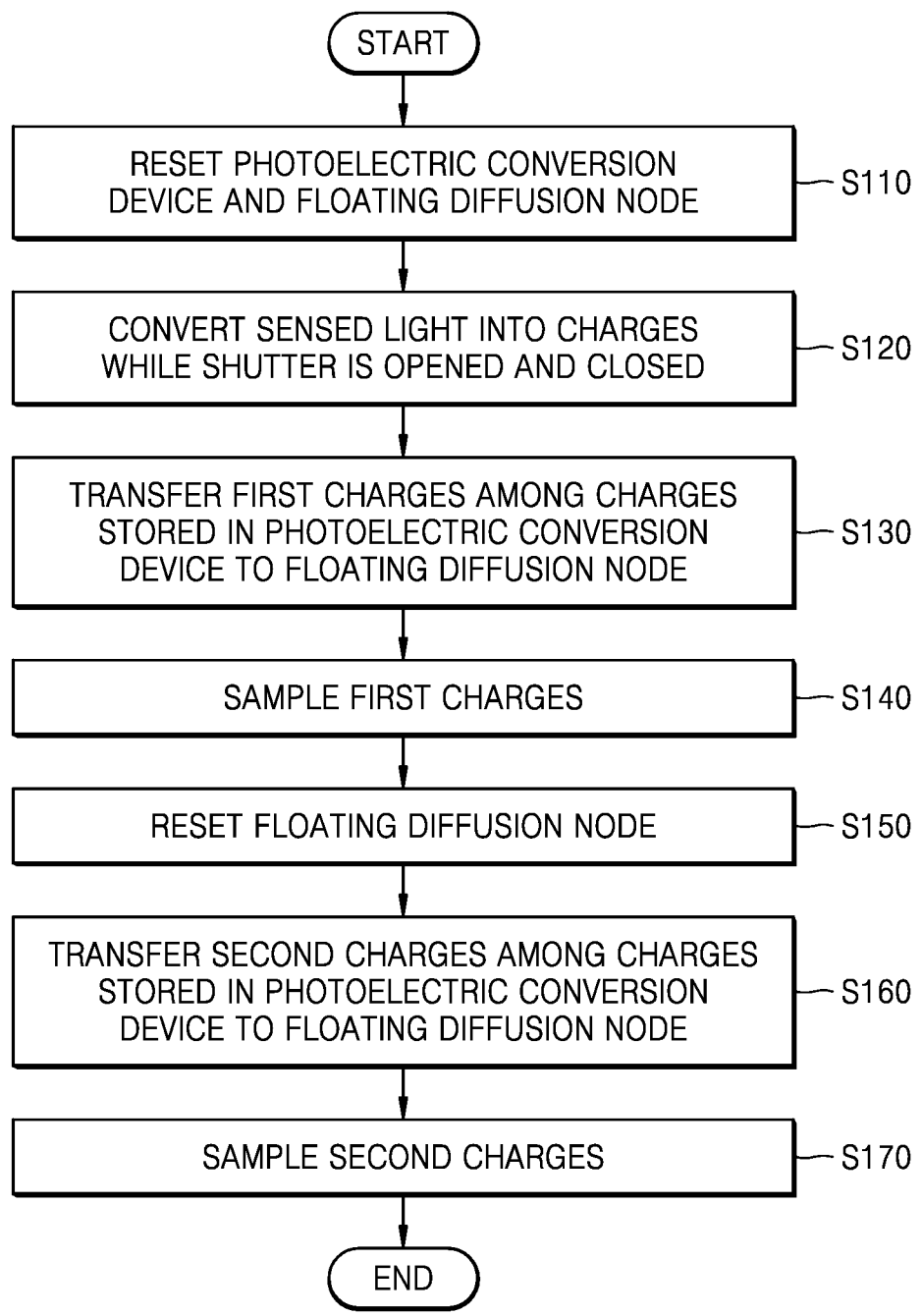
FIG. 6 is a flowchart of an operating method of an image sensor, according to an example embodiment of the disclosure.

FIG. 6 is a flowchart of an operating method of an image sensor, according to an example embodiment of the disclosure. FIG. 6 is referenced in conjunction with FIGS. 4 and 5.

In operation S110, the photoelectric conversion device (e.g., the photodiode PD) and the floating diffusion node FD may be reset. According to an example embodiment, as both the transfer signal TS and the reset signal RS are at a high level, charges accumulated in the photoelectric conversion device and the floating diffusion node FD may be removed.

In operation S120, sensed light may be converted into charges while a shutter is opened and closed once. A period in which the shutter is opened and closed once may be referred to as a light-sensing period. During a light-sensing period, because charges on an object have to be sufficiently sensed, both the reset signal RS and the transfer signal TS may be at a low level.

In operation S130, some of the charges stored in the photoelectric conversion device may be transferred to the floating diffusion node FD. According to an example embodiment, the transfer signal TS may be at a high level, and the reset signal RS may be at a low level. According to an example embodiment, because it is assumed that the FWC of the photodiode PD is greater than the FWC of the floating diffusion node FD, due to an acceptance limit of the floating diffusion node FD, not all of the charges stored in the photoelectric conversion device, but only some of the charges may be transferred to the floating diffusion node FD. As described above, the transfer operation in operation S130 may be referred to as a first transfer operation.

In operation S140, charges transferred to the floating diffusion node FD may be converted into a signal having a potential value through sampling. The charges transferred to the floating diffusion node FD may be some of the charges stored in the photoelectric conversion device. In this case, both the transfer signal TS and the reset signal RS may be at a low level.

In operation S150, after the charges stored in the floating diffusion node FD are read through sampling, the floating diffusion node FD may be reset. In this case, the transfer signal TS may be at a low level and the reset signal RS may be at a high level.

In operation S160, the remaining charges that have not been transferred to the floating diffusion node FD through the first transfer operation from among the charges generated by the photoelectric conversion device may be transferred to the floating diffusion node FD. According to an example embodiment, the transfer signal TS may be at a high level and the reset signal RS may be at a low level. The transfer operation in operation S160 may be referred to as a second transfer operation.

In operation S170, the remaining charges that have not been transferred to the floating diffusion node FD through the first transfer operation from among the charges generated by the photoelectric conversion device may be converted into a signal having a potential value through sampling. In this case, both the transfer signal TS and the reset signal RS may be at a low level.

Figure 7:
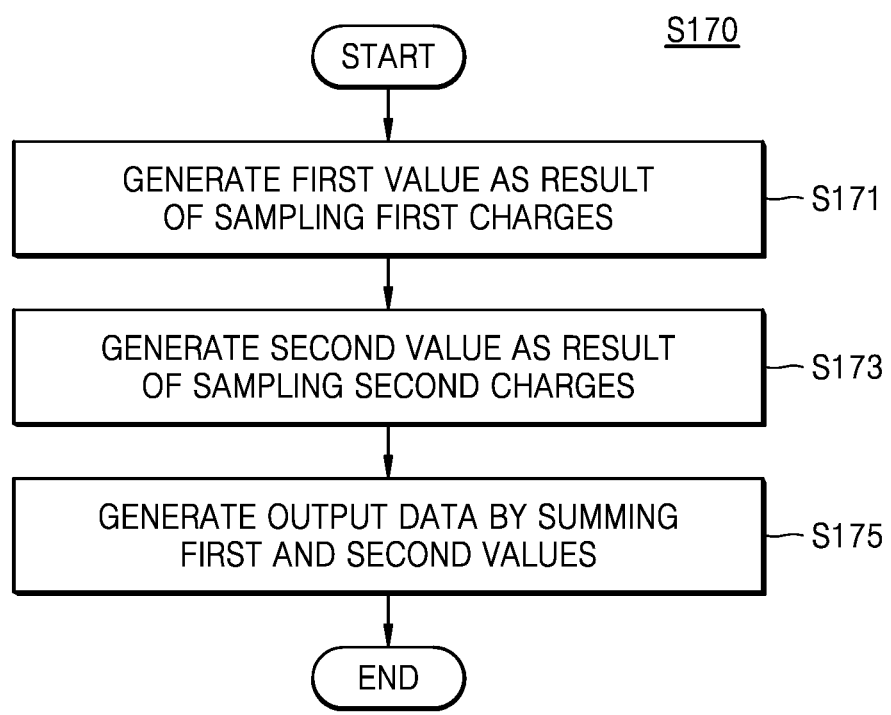
FIG. 7 is a flowchart of operation S170 of the operating method of the image sensor, according to an example embodiment of the disclosure.

FIG. 7 is a flowchart of operation S170 of the operating method of the image sensor, according to an example embodiment of the disclosure.

Operation S170 may be detailed as the following operations.

In operation S171, due to an acceptance limit of the floating diffusion node FD, as a result of some of the charges stored in the photoelectric conversion device being transferred to the floating diffusion node FD, some of sensed charges may be sampled and accordingly, a signal having a first voltage level may be generated.

In operation S173, the rest of the charges stored in the photoelectric conversion device may be sampled and accordingly, a signal having a second voltage level may be generated.

In operation S175, output data may be generated based on the signal having the first voltage level and the signal having the second voltage level. In an example embodiment, the output data may be generated by obtaining a difference between a signal according to the reset operation and the signal having the first voltage level, obtaining a difference between the signal according to the reset operation and the signal having the second voltage level, and summing the differences.

As a result, the output data may correspond to the sum of a result value obtained by subtracting a voltage according to operation S140 from a voltage according to operation S110 and a result value obtained by subtracting a voltage according to operation S170 from the voltage according to operation S110. That is, Equation 1 may be satisfied.

Figure 8B:
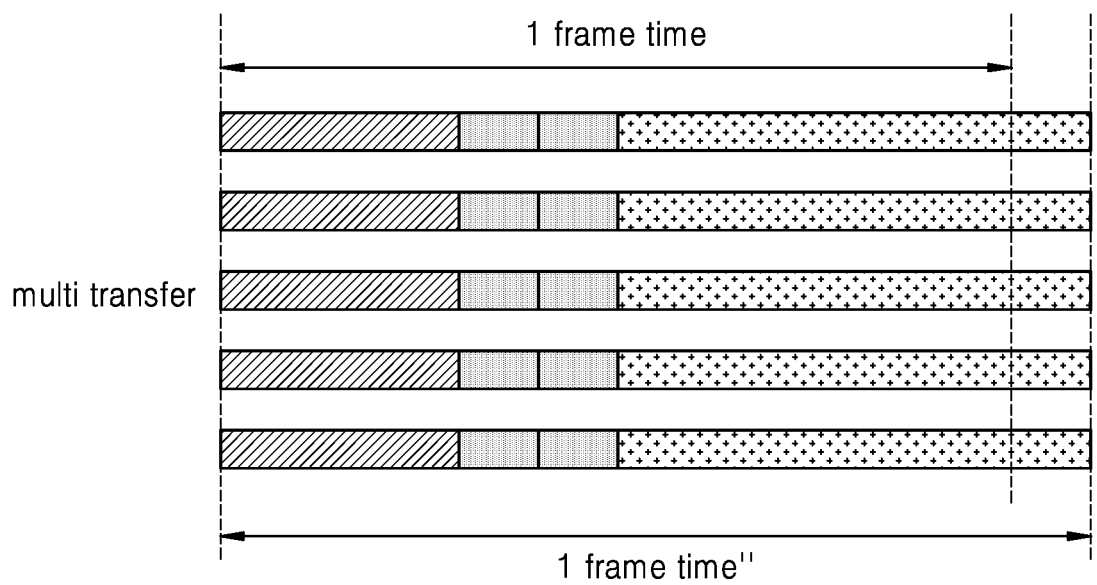

FIGS. 8A and 8B are views for comparing processing speeds according to processing methods of an image sensor according to an example embodiment of the disclosure.

FIG. 8A illustrates image processing for an image of an object captured by a rolling shutter method. Referring to FIG. 8A, in order to sense one frame, an effective integration time (EIT) and a CDS and data readout time may be required for each row.

The rolling shutter method is a method of sensing an image by scanning an object in a vertical (or horizontal) direction. With respect to the imaging speed of the image sensor 100 when the image sensor 100 senses an object by using the rolling shutter method, a time required for data processing when a multi-transfer method is used may additionally take as much as the product of a time (repeatedCDS) required to process sampling at least once more and a number (#of Row-1) that is one less than the number of rows, compared to that required for data processing when the multi-transfer method is not used. In short, the multi-transfer method may cause an additional delay in data processing of the image sensor 100 capturing an image of an object by the rolling shutter method. The delay in data processing may intensify a jello effect, which causes the image to shake unnaturally.

FIG. 8B illustrates image processing of an image of an object captured by a digital process shutter (DPS) method. The DPS method is an example of a global shutter method in which object sensing (light reception) and sampling may be simultaneously performed.

In the DPS method, because an object may be sensed at the same time for all rows without sensing data for each row, when a multi-transfer method is used, only a time (repeatedCDS) required to process sampling at least once more may be additionally required compared to when the multi-transfer method is not used. Therefore, when the DPS method is applied to an image sensor (i.e., the image sensor 100 in FIG. 1) using multiple transfers, a delay in processing speed may be reduced compared to the rolling shutter method in which a processing time is delayed by as much as the number of rows. In short, the inventive concept of the disclosure may greatly improve a processing speed when applied to a global shutter method, and may be particularly useful for a DPS method.

Figure 9:
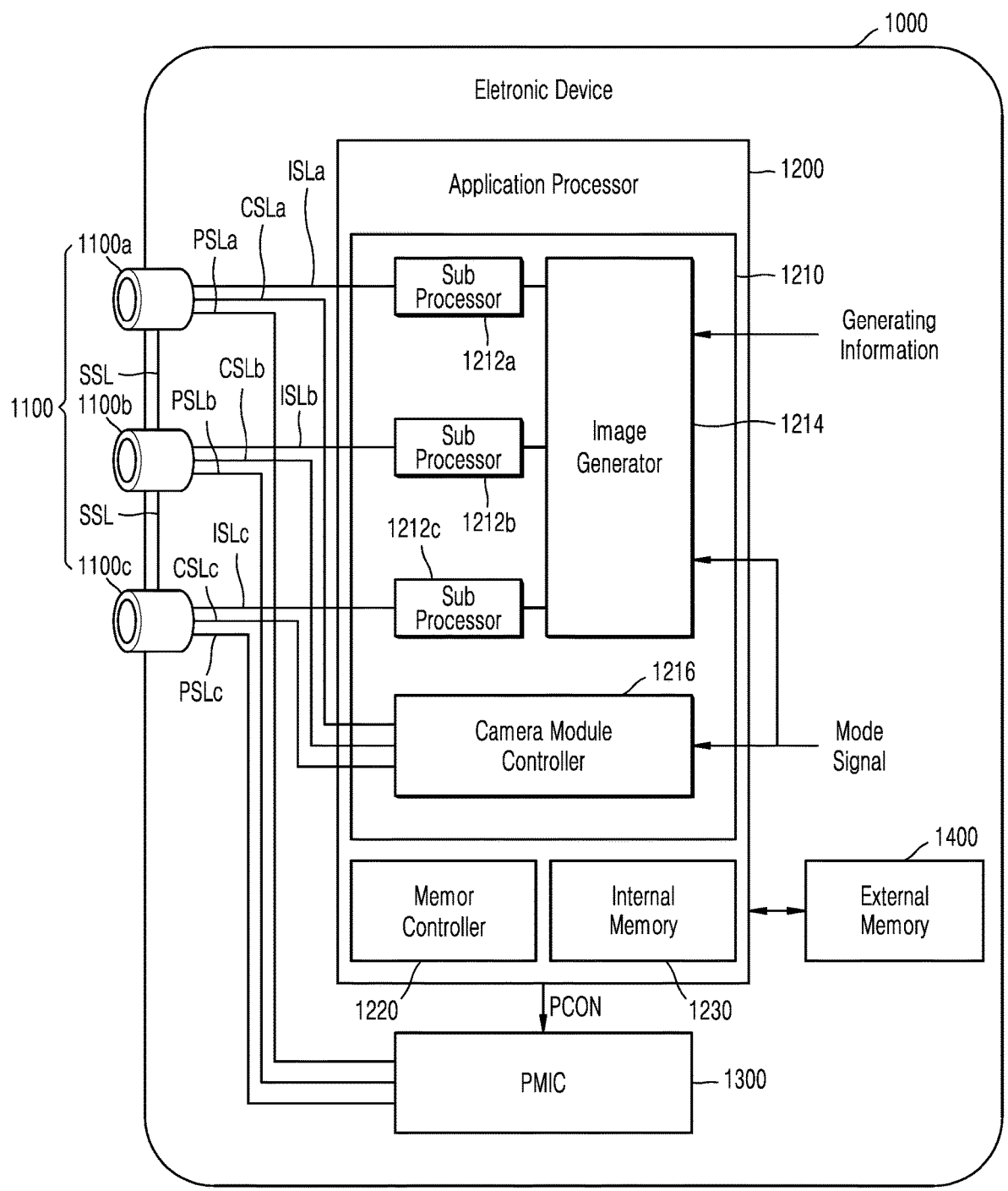
FIG. 9 is a block diagram of an electronic device including a multi-camera module to which an image sensor according to an example embodiment of the disclosure is applied.
Figure 10:
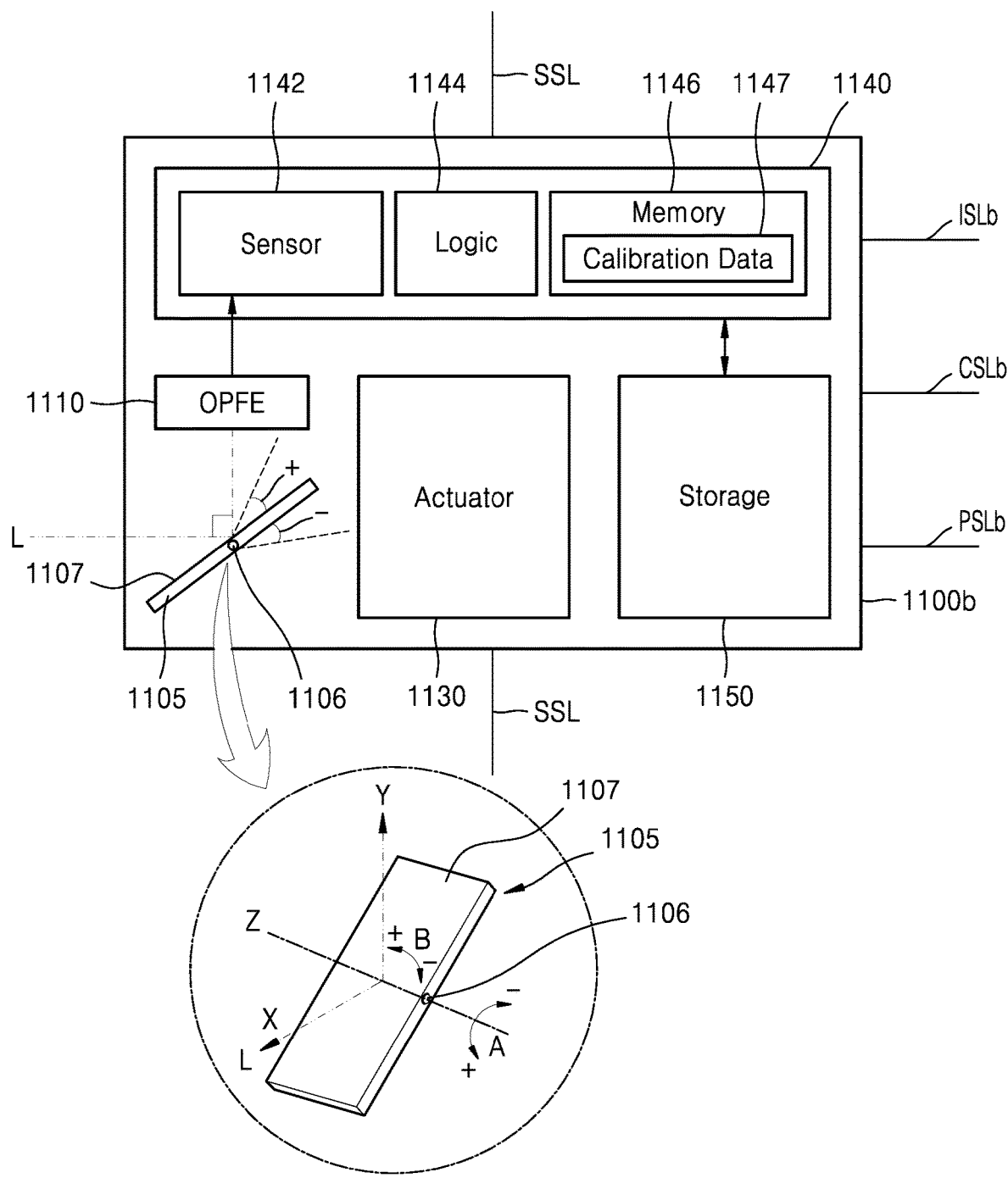
FIG. 10 is a detailed block diagram of the multi-camera module of FIG. 9.

FIG. 9 is a block diagram of an electronic device including a multi-camera module to which an image sensor according to an example embodiment of the disclosure is applied, and FIG. 10 is a detailed block diagram of the multi-camera module of FIG. 9.

Referring to FIG. 9, an electronic device 1000 may include a camera module group 1100, an application processor 1200, a power management integrated circuit (PMIC) 1300, and an external memory 1400. The image sensor 100 of FIG. 1 may be applied to the camera module group 1100 of FIG. 9.

The camera module group 1100 may include a plurality of camera modules 1100a, 1100b, and 1100c. Although three camera modules 1100a, 1100b, and 1100c are illustrated in FIG. 9, embodiments are not limited thereto. In some embodiments, the camera module group 1100 may be modified to include only two camera modules or include "n" camera modules, where "n" is a natural number of at least 4.

The detailed configuration of the camera module 1100b will be described with reference to FIG. 10 below. The descriptions below may also be applied to the other camera modules 1100a and 1100c.

Referring to FIG. 10, the camera module 1100b may include a prism 1105, an optical path folding element (OPFE) 1110, an actuator 1130, an image sensing device 1140, and a storage 1150.

The prism 1105 may include a reflective surface 1107 of a light reflecting material and may change the path of light L incident from outside.

In some embodiments, the prism 1105 may change the path of the light L incident in a first direction X into a second direction Y perpendicular to the first direction X. The prism 1105 may rotate the reflective surface 1107 of the light reflecting material in a direction A around a central shaft 1106 or rotate the central shaft 1106 in a direction B to change the path of the light L incident in the first direction X into the second direction Y perpendicular to the first direction X. In this case, the OPFE 1110 may move in a third direction Z, which is perpendicular to the first and second directions X and Y.

In some embodiments, an A-direction maximum rotation angle of the prism 1105 may be less than or equal to 15 degrees in a plus (+) A direction and greater than 15 degrees in a minus (−) A direction, but embodiments are not limited thereto.

In some embodiment, the prism 1105 may move by an angle of about 20 degrees or in a range from about 10 degrees to about 20 degrees or from about 15 degrees to about 20 degrees in a plus or minus B direction. In this case, an angle by which the prism 1105 moves in the plus B direction may be the same as or similar, within a difference of about 1 degree, to an angle by which the prism 1105 moves in the minus B direction.

In some embodiments, the prism 1105 may move the reflective surface 1107 of the light reflecting material in the third direction Z parallel with an extension direction of the central shaft 1106.

The OPFE 1110 may include, for example, "m" optical lenses, where "m" is a natural number. The "m" lenses may move in the second direction Y and change an optical zoom ratio of the camera module 1100b. For example, when the default optical zoom ratio of the camera module 1100b is Z, the optical zoom ratio of the camera module 1100b may be changed to 3Z, 5Z, or greater by moving the "m" optical lenses included in the OPFE 1110.

The actuator 1130 may move the OPFE 1110 or an optical lens to a certain position. For example, the actuator 1130 may adjust the position of the optical lens such that an image sensor 1142 is positioned at a focal length of the optical lens for accurate sensing.

The image sensing device 1140 may include the image sensor 1142, a control logic 1144, and a memory 1146. The image sensor 1142 may sense an image of an object using the light L provided through the optical lens. The control logic 1144 may control all operations of the camera module 1100b. For example, the control logic 1144 may control operation of the camera module 1100b according to a control signal provided through a control signal line CSLb.

The memory 1146 may store information, such as calibration data 1147, necessary for the operation of the camera module 1100b. The calibration data 1147 may include information, which is necessary for the camera module 1100b to generate image data using the light L provided from outside. For example, the calibration data 1147 may include information about the degree of rotation, information about a focal length, information about an optical axis, or the like. When the camera module 1100b is implemented as a multi-state camera that has a focal length varying with the position of the optical lens, the calibration data 1147 may include a value of a focal length for each position (or state) of the optical lens and information about auto focusing.

The storage 1150 may store image data sensed by the image sensor 1142. The storage 1150 may be provided outside the image sensing device 1140 and may form a stack with a sensor chip of the image sensing device 1140. In some embodiments, the storage 1150 may include electrically erasable programmable read-only memory (EEPROM), but embodiments are not limited thereto.

Referring to FIGS. 9 and 10, in some embodiments, each of the camera modules 1100a, 1100b, and 1100c may include the actuator 1130. Accordingly, the camera modules 1100a, 1100b, and 1100c may include the calibration data 1147, which is the same or different among the camera modules 1100a, 1100b, and 1100c according to the operation of the actuator 1130 included in each of the camera modules 1100a, 1100b, and 1100c.

In some embodiments, one (e.g., the camera module 1100b) of the camera modules 1100a, 1100b, and 1100c may be of a folded-lens type including the prism 1105 and the OPFE 1110 while the other camera modules (e.g., the camera modules 1100a and 1100c) may be of a vertical type that does not include the prism 1105 and the OPFE 1110. However, embodiments are not limited thereto.

In some embodiments, one (e.g., the camera module 1100c) of the camera modules 1100a, 1100b, and 1100c may include a vertical depth camera, which extracts depth information using an infrared ray (IR). In this case, the application processor 1200 may generate a three-dimensional (3D) depth image by merging image data provided from the depth camera with image data provided from another camera module (e.g., the camera module 1100a or 1100b).

In some embodiments, at least two camera modules (e.g., 1100a and 1100b) among the camera modules 1100a, 1100b, and 1100c may have different field-of-views. In this case, the two camera modules (e.g., 1100a and 1100b) among the camera modules 1100a, 1100b, and 1100c may respectively have different optical lenses, but embodiments are not limited thereto.

In some embodiments, the camera modules 1100a, 1100b, and 1100c may have different field-of-views from one another. In this case, the camera modules 1100a, 1100b, and 1100c may respectively have different optical lenses, but embodiments are not limited thereto.

In some embodiments, the camera modules 1100a, 1100b, and 1100c may be physically separated from one another. In other words, the sensing area of the image sensor 1142 is not divided and used by the camera modules 1100a, 1100b, and 1100c, but the image sensor 1142 may be independently included in each of the camera modules 1100a, 1100b, and 1100c.

Referring back to FIG. 9, the application processor 1200 may include an image processing unit 1210, a memory controller 1220, and an internal memory 1230. The application processor 1200 may be separately implemented from the camera modules 1100a, 1100b, and 1100c. For example, the application processor 1200 and the camera modules 1100a, 1100b, and 1100c may be implemented in different semiconductor chips.

The image processing unit 1210 may include a plurality of sub-image processors 1212a, 1212b, and 1212c, an image generator 1214, and a camera module controller 1216.

The image processing unit 1210 may include as many sub-image processors 1212a, 1212b, and 1212c as the camera modules 1100a, 1100b, and 1100c.

Pieces of image data respectively generated by the camera modules 1100a, 1100b, and 1100c may be respectively provided to the sub-image processors 1212a, 1212b, and 1212c through image signal lines ISLa, ISLb, and ISLc separated from each other. For example, image data generated by the camera module 1100a may be provided to the sub-image processor 1212a through the image signal line ISLa, image data generated by the camera module 1100b may be provided to the sub-image processor 1212b through the image signal line ISLb, and image data generated by the camera module 1100c may be provided to the sub-image processor 1212c through the image signal line ISLc. Such image data transmission may be performed using, for example, a mobile industry processor interface (MIPI) based camera serial interface (CSI), but embodiments are not limited thereto.

In some embodiments, a single sub-image processor may be provided for a plurality of camera modules. For example, differently from FIG. 9, the sub-image processors 1212a and 1212c may not be separated but may be integrated into a single sub-image processor, and the image data provided from the camera module 1100a or the camera module 1100c may be selected by a selection element (e.g., a multiplexer) and then provided to the integrated sub-image processor.

The image data provided to each of the sub-image processors 1212a, 1212b, and 1212c may be provided to the image generator 1214. The image generator 1214 may generate an output image using the image data provided from each of the sub-image processors 1212a, 1212b, and 1212c according to image generation information or a mode signal.

In detail, the image generator 1214 may generate the output image by merging at least portions of respective pieces of image data, which are respectively generated by the camera modules 1100a, 1100b, and 1100c having different field-of-views, according to the image generation information or the mode signal. Alternatively, the image generator 1214 may generate the output image by selecting one of pieces of image data, which are respectively generated by the camera modules 1100a, 1100b, and 1100c having different field-of-views, according to the image generation information or the mode signal.

In some embodiments, the image generation information may include a zoom signal or a zoom factor. In some embodiments, the mode signal may be based on a mode selected by a user.

When the image generation information includes a zoom signal or a zoom factor and the camera modules 1100a, 1100b, and 1100c have different field-of-views, the image generator 1214 may perform different operations according to different kinds of zoom signals. For example, when the zoom signal is a first signal, the image generator 1214 may merge image data output from the camera module 1100a and image data output from the camera module 1100c and then generate an output image by using a merged image signal and image data output from the camera module 1100b and not used for merging. When the zoom signal is a second signal different from the first signal, the image generator 1214 may generate an output image by selecting one of the pieces of image data respectively output from the camera modules 1100a, 1100b, and 1100c, instead of performing the merging. However, embodiments are not limited thereto, and a method of processing image data may be changed whenever necessary.

In some embodiments, the image generator 1214 may receive a plurality of pieces of image data, which have different exposure times, from at least one of the sub-image processors 1212a, 1212b, and 1212c and perform high dynamic range (HDR) processing on the pieces of image data, thereby generating merged image data having an increased dynamic range.

The camera module controller 1216 may provide a control signal to each of the camera modules 1100a, 1100b, and 1100c. A control signal generated by the camera module controller 1216 may be provided to a corresponding one of the camera modules 1100a, 1100b, and 1100c through a corresponding one of control signal lines CSLa, CSLb, and CSLc, which are separated from one another.

One (e.g., the camera module 1100b) of the camera modules 1100a, 1100b, and 1100c may be designated as a master camera according to the mode signal or the image generation signal including a zoom signal, and the other camera modules (e.g., 1100a and 1100c) may be designated as slave cameras. Such designation information may be included in a control signal and provided to each of the camera modules 1100a, 1100b, and 1100c through a corresponding one of the control signal lines CSLa, CSLb, and CSLc, which are separated from one another.

A camera module operating as a master or a slave may be changed according to a zoom factor or an operation mode signal. For example, when the field-of-view of the camera module 1100a is greater than that of the camera module 1100b and the zoom factor indicates a low zoom ratio, the camera module 1100a may operate as a master and the camera module 1100b may operate as a slave. Contrarily, when the zoom factor indicates a high zoom ratio, the camera module 1100b may operate as a master and the camera module 1100a may operate as a slave.

In some embodiments, a control signal provided from the camera module controller 1216 to each of the camera modules 1100a, 1100b, and 1100c may include a sync enable signal. For example, when the camera module 1100b is a master camera and the camera module 1100a is a slave camera, the camera module controller 1216 may transmit the sync enable signal to the camera module 1100b. The camera module 1100b provided with the sync enable signal may generate a sync signal based on the sync enable signal and may provide the sync signal to the camera modules 1100a and 1100c through a sync signal line SSL. The camera modules 1100a, 1100b, and 1100c may be synchronized with the sync signal and may transmit image data to the application processor 1200.

In some embodiments, a control signal provided from the camera module controller 1216 to each of the camera modules 1100a, 1100b, and 1100c may include mode information according to the mode signal. The camera modules 1100a, 1100b, and 1100c may operate in a first operation mode or a second operation mode in relation with a sensing speed based on the mode information.

In the first operation mode, the camera modules 1100a, 1100b, and 1100c may generate an image signal at a first speed (e.g., at a first frame rate), encode the image signal at a second speed higher than the first speed (e.g., at a second frame rate higher than the first frame rate), and transmit an encoded image signal to the application processor 1200. In this case, the second speed may be up to 30 times greater than the first speed.

The application processor 1200 may store the received image signal, i.e., the encoded image signal, in the internal memory 1230 therein or the external memory 1400 outside the application processor 1200. Thereafter, the application processor 1200 may read the encoded image signal from the internal memory 1230 or the external memory 1400, decode the encoded image signal, and display image data generated based on a decoded image signal. For example, a corresponding one of the sub-image processors 1212a, 1212b, and 1212c of the image processing unit 1210 may perform the decoding and may also perform image processing on the decoded image signal.

In the second operation mode, the camera modules 1100a, 1100b, and 1100c may generate an image signal at a third speed lower than the first speed (e.g., at a third frame rate lower than the first frame rate) and transmit the image signal to the application processor 1200. The image signal provided to the application processor 1200 may not have been encoded. The application processor 1200 may perform image processing on the image signal or store the image signal in the internal memory 1230 or the external memory 1400.

The PMIC 1300 may provide power, e.g., a power supply voltage, to each of the camera modules 1100a, 1100b, and 1100c. For example, under the control of the application processor 1200, the PMIC 1300 may provide first power to the camera module 1100a through a power signal line PSLa, second power to the camera module 1100b through a power signal line PSLb, and third power to the camera module 1100c through a power signal line PSLc.

The PMIC 1300 may generate power corresponding to each of the camera modules 1100a, 1100b, and 1100c and adjust the level of the power, in response to a power control signal PCON from the application processor 1200. The power control signal PCON may include a power adjustment signal for each operation mode of the camera modules 1100a, 1100b, and 1100c. For example, the operation mode may include a low-power mode. In this case, the power control signal PCON may include information about a camera module to operate in the low-power mode and a power level to be set. The same or different levels of power may be respectively provided to the camera modules 1100a, 1100b, and 1100c. The level of power may be dynamically changed.

While the inventive concept has been particularly shown and described with reference to embodiments thereof, it will be understood that various changes in form and details may be made therein without departing from the spirit and scope of the following claims.

What is claimed is:

1. An image sensor comprising:
   a pixel including
      a photoelectric conversion device configured to convert sensed light into charges and to store the charges prior to providing the charges to a floating diffusion node, and
      the floating diffusion node configured to store the charges provided from the photoelectric conversion device;
   a timing generator configured to
      generate a reset signal including, prior to a light-sensing period, a first reset signal pulse for enabling an erasing of charges stored in at least one of the photoelectric conversion device and the floating diffusion node, and
      generate a transfer signal including, subsequent to the light-sensing period, at least two transfer signal pulses, each transfer signal pulse enabling a moving of charges stored in the photoelectric conversion device to the floating diffusion node; and
   a readout circuit configured to generate output data by summing results of performing at least two samplings for the floating diffusion node based on the at least two transfer signal pulses,
   wherein the reset signal and the transfer signal each include a first logical level and a second logical level,
   wherein the at least two transfer signal pulses include a first transfer signal pulse and a second transfer signal pulse, and
   wherein the pixel is configured to:
      transfer a first subset of the charges stored in the photoelectric conversion device to the floating diffusion node based on the first transfer signal pulse, and
      transfer a second subset of the charges stored in the photoelectric conversion device to the floating diffusion node based on the second transfer signal pulse.

2. The image sensor of claim 1, wherein the timing generator is further configured to generate, subsequent to the first transfer signal pulse and prior to the second transfer signal pulse, a second reset signal pulse.

3. The image sensor of claim 1, wherein the readout circuit is further configured to generate a first value by sampling the first subset of the charges, generate a second value by sampling the second subset of the charges, and generate the output data based on the first value and the second value.

4. The image sensor of claim 1, wherein the photoelectric conversion device is reset when both the reset signal and the transfer signal are at the first logic level,
   the floating diffusion node is reset when the reset signal is at the first logic level and the transfer signal is at the second logic level, and
   the charges stored in the photoelectric conversion device are transferred to the floating diffusion node when the reset signal is at the second logic level and the transfer signal is at the first logic level.

5. The image sensor of claim 1, wherein a readout period subsequent to the light-sensing period includes a first time period, a second time period, and a third time period,
   wherein, in the first time period, the transfer signal is at the first logic level and the reset signal is at the second logic level,
   in the second time period following the first time period, the reset signal is at the first logic level and the transfer signal is at the second logic level, and
   in the third time period following the second time period, the reset signal is at the second logic level and the transfer signal is at the first logic level.

6. The image sensor of claim 5, wherein the first time period and the third time period correspond to a period in which the charges stored in the photoelectric conversion device are transferred to the floating diffusion node, and
   the second time period corresponds to a period in which the floating diffusion node is reset.

7. The image sensor of claim 6, wherein a readout period prior to the light-sensing period includes a fourth time period and a fifth time period,
   wherein, in the fourth time period preceding the first time period, the floating diffusion node is reset, and
   in the fifth time period preceding the fourth time period, the photoelectric conversion device is reset.

8. The image sensor of claim 1, wherein the pixel further includes:
   a transfer transistor configured to receive the transfer signal through a transfer gate terminal and connect the photoelectric conversion device to the floating diffusion node; and
   a reset transistor configured to receive the reset signal through a reset gate terminal and reset the floating diffusion node.

9. The image sensor of claim 8, further comprising:
   a driving transistor configured to amplify a signal of the floating diffusion node; and
   a selection transistor configured to select the pixel from among a plurality of pixels.

10. The image sensor of claim 8, wherein the at least two transfer signal pulses include a first transfer signal pulse and a second transfer signal pulse,
    wherein the transfer transistor is configured to transfer a first subset of the charges stored in the photoelectric conversion device to the floating diffusion node by being turned on in response to the first transfer signal pulse, and
    transfer a second subset of the charges stored in the photoelectric conversion device to the floating diffusion node by being turned on in response to the second transfer signal pulse.

11. The image sensor of claim 8, wherein a first subset of the charges stored in the photoelectric conversion device are transferred to the floating diffusion node, when the transfer transistor is turned on in a first period in which the reset transistor is turned off, the floating diffusion node is reset in a second period in which the reset transistor is turned on and the transfer transistor is turned off, the second period following the first period, and a second subset of the charges stored in the photoelectric conversion device are transferred to the floating diffusion node, when the transfer transistor is turned on in a third period in which the reset transistor is turned off, the third period following the second period.

12. An operating method of an image sensor including a photoelectric conversion device and a floating diffusion node, the operating method comprising:

resetting the photoelectric conversion device and the floating diffusion node;

converting sensed light into charges while a shutter of the image sensor is opened and closed once;

transferring a first subset of the charges from the photoelectric conversion device to the floating diffusion node;

resetting the floating diffusion node; and transferring a second subset of the charges from the photoelectric conversion device to the floating diffusion node.

13. The operating method of claim 12, further comprising: sampling charges stored in the floating diffusion node.

14. The operating method of claim 13, wherein the sampling of the charges stored in the floating diffusion node includes:

generating a first value by sampling the first subset of the charges;

generating a second value by sampling the second subset of the charges; and generating output data based on the first value and the second value.

15. The operating method of claim 12, wherein the transferring of the first subset of the charges to the floating diffusion node is performed by applying a transfer signal including a pulse to a transfer transistor when a reset transistor is in a floating state.

16. The operating method of claim 12, wherein the resetting of the floating diffusion node is performed by turning on a reset transistor when a transfer transistor is turned off.

17. The operating method of claim 12, wherein the resetting of the floating diffusion node is performed after the transferring of the first subset of the charges to the floating diffusion node, and the transferring of the second subset of the charges to the floating diffusion node is performed after the resetting of the floating diffusion node.

18. An image sensor comprising:

a pixel array including at least one pixel including a photoelectric conversion device configured to convert sensed light into charges and a floating diffusion node;

a row decoder configured to provide a control signal to the at least one pixel through at least one row line;

a timing generator configured to generate a reset signal including, prior to a light-sensing period, a first reset signal pulse for enabling an erasing of charges stored in at least one of the photoelectric conversion device and the floating diffusion node, generate a transfer signal including, subsequent to the light-sensing period, at least two transfer signal pulses, each transfer signal pulse enabling a moving of charges stored in the photoelectric conversion device to the floating diffusion node, and generate a ramp signal for sampling; and a readout circuit configured to receive a pixel signal from the pixel array through at least one column line and generate output data by sampling the pixel signal based on the ramp signal, wherein the at least two transfer signal pulses include a first transfer signal pulse and a second transfer signal pulse, wherein the timing generator is further configured to generate, subsequent to the first transfer signal pulse and prior to the second transfer signal pulse, a second reset signal pulse for resetting the floating diffusion node, and wherein the pixel is configured to:

transfer a first subset of the charges stored in the photoelectric conversion device to the floating diffusion node based on the first transfer signal pulse, and transfer a second subset of the charges stored in the photoelectric conversion device to the floating diffusion node based on the second transfer signal pulse.

\* \* \* \* \*